United States Patent [19]
Konishi et al.

[11] Patent Number: 5,815,462
[45] Date of Patent: Sep. 29, 1998

[54] SYNCHRONOUS SEMICONDUCTOR MEMORY DEVICE AND SYNCHRONOUS MEMORY MODULE

[75] Inventors: Yasuhiro Konishi; Hisashi Iwamoto; Takashi Araki; Yasumitsu Murai; Seiji Sawada, all of Hyogo, Japan

[73] Assignees: Mitsubishi Denki Kabushiki Kaisha; Mitsubishi Electric Engineering Co., Ltd., both of Tokyo, Japan

[21] Appl. No.: 800,905

[22] Filed: Feb. 12, 1997

[30] Foreign Application Priority Data

Jun. 27, 1996 [JP] Japan ................................ 8-167348

[51] Int. Cl.⁶ ............................................. G11C 8/00
[52] U.S. Cl. ............... 365/233; 365/230.01; 365/230.08; 365/189.05
[58] Field of Search ............................. 365/233, 230.01, 365/230.08, 189.05, 230.04

[56] References Cited

U.S. PATENT DOCUMENTS 5,412,615 5/1995 Noro et al. ............................... 365/233
5,631,866 5/1997 Oka et al. ............................. 365/189.05
5,666,323 9/1997 Zagar ....................................... 365/233

FOREIGN PATENT DOCUMENTS 4-85792 3/1992 Japan .

OTHER PUBLICATIONS

Nitta, Yasuhiko, et al: "A 1.6GB/s Data–Rate 1Gb Synchronous DRAM with Hierarchical Square–Shaped Memory Block and Distributed Bank Architecture", *IEEE*, 1996.

Saeki, Takanon, et al: "A 2.5ns Clock Access 250MHz 256Mb SDRAM with a Synchronous Mirror Delay", *IEEE*, 1996.

*Primary Examiner*—Huan Hoang
*Attorney, Agent, or Firm*—McDermott, Will & Emery

[57] ABSTRACT

A first clock signal for controlling the inputting of an external signal and for controlling internal operation and a second clock signal for controlling data output are applied to separate clock input nodes, respectively. Data output timing with respect to the first clock signal can be adjusted and thus clock access time and data hold time can be adjusted. Internal data read path is pipelined to include a first transfer gate responsive to the first clock signal for transferring internal read data and a second transfer gate responsive to the second clock signal for transferring the internal read data from the first transfer gate for external outputting through an output buffer. A synchronous semiconductor memory device is provided capable of setting clock access time and data hold time at the optimal values depending on the application and of reducing the clock access time.

20 Claims, 25 Drawing Sheets

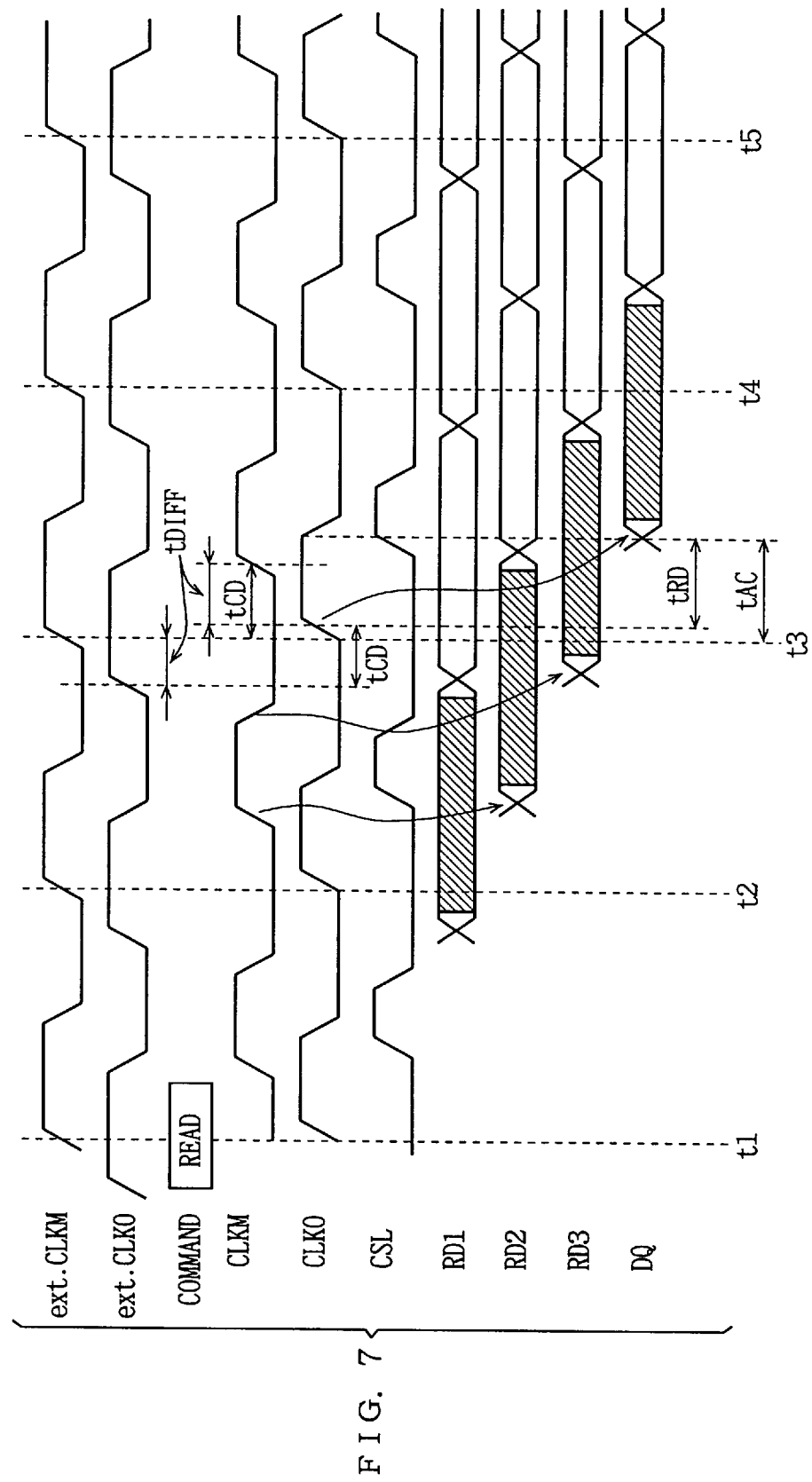
F I G. 7

CAS LATENCY :4
BURST LENGTH :4

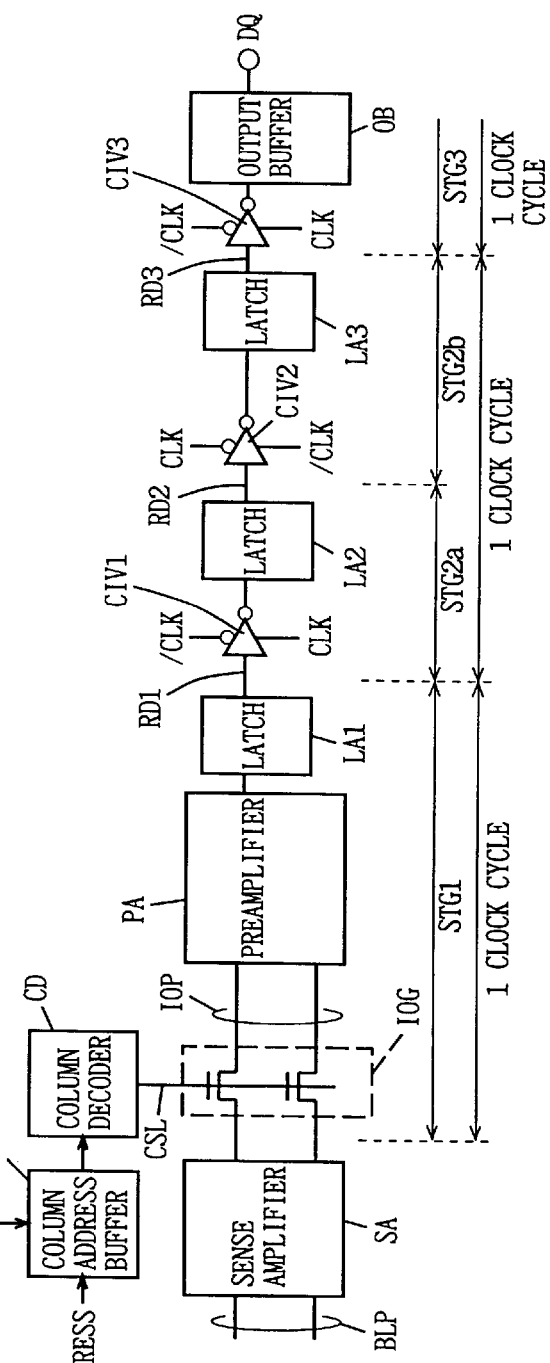
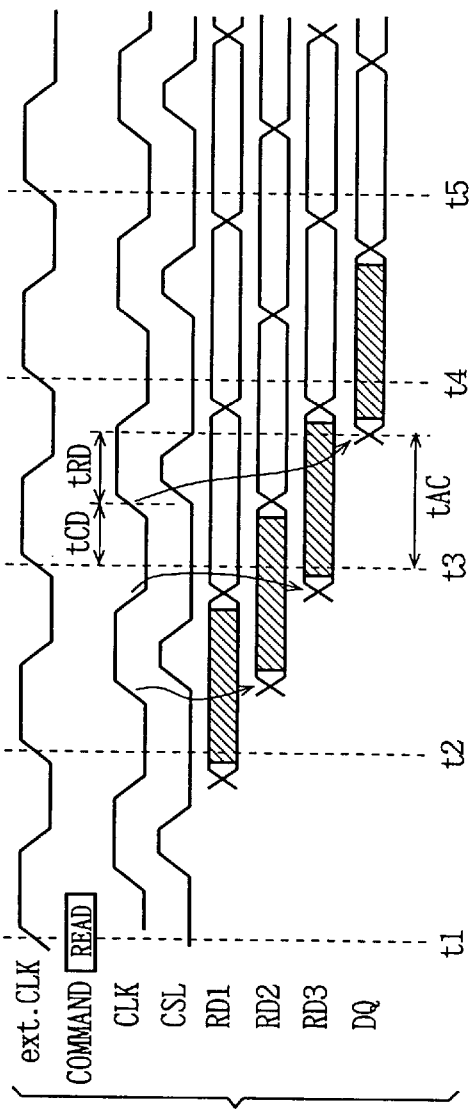
FIG. 31A PRIOR ART
FIG. 31B PRIOR ART

FIG. 33 PRIOR ART
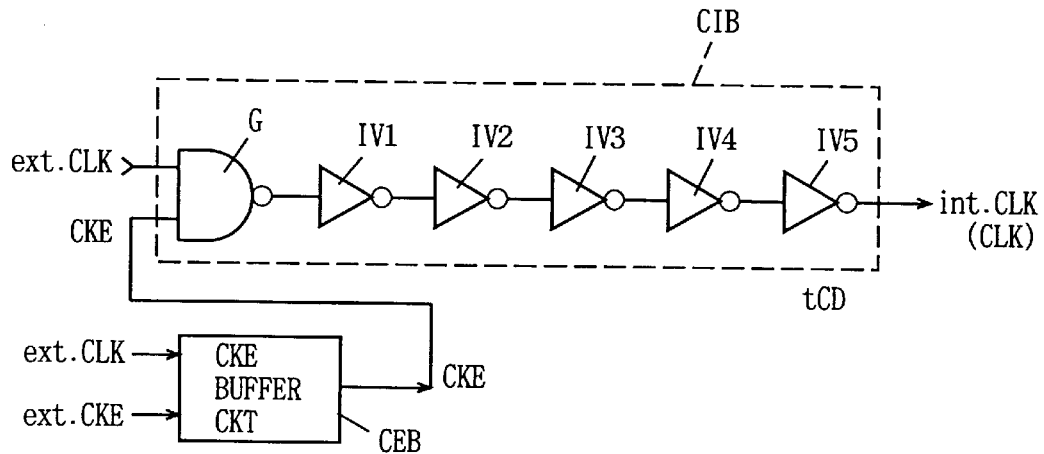
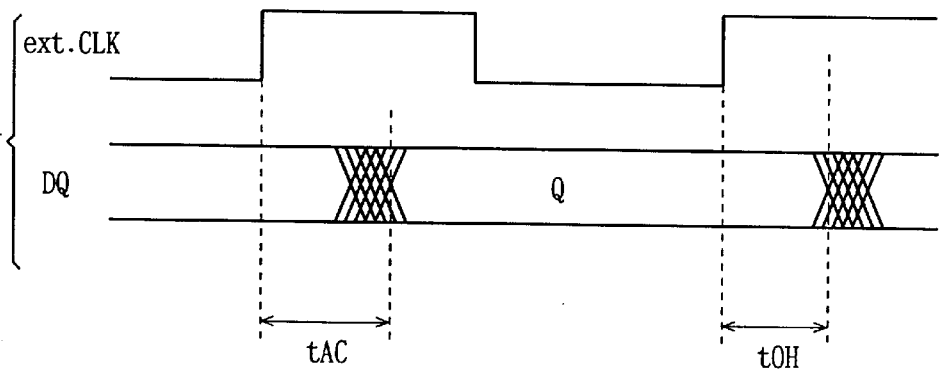
FIG. 34 PRIOR ART

SYNCHRONOUS SEMICONDUCTOR MEMORY DEVICE AND SYNCHRONOUS MEMORY MODULE

BACKGROUND OF THE INVENTION

1. Field of the Invention

The present invention relates to a synchronous semiconductor memory device. It particularly relates to a configuration of a internal read data transfer portion for achieving fast access.

2. Description of the Background Art

Operating speed of microprocessors and memory devices have been increased to aim improvement in performance of processing system. However, since memory devices require the operations of selecting a memory cell and of internally transferring and reading data in the selected memory cell, the operating speed of memory devices cannot catch up with that of microprocessors. Accordingly, performance of a processing system depends on the access speed of the memory device, which accordingly becomes a bottleneck in improvement in processing system performance. Recently, various memory LSIs (Large Scale Integrated Circuit) have been proposed to solve such a gap in operating speed between microprocessors and memory devices. Such memory LSIs are all characterized in that data input/output is performed in synchronization with an externally applied clock signal such as a system clock to increase their data transfer rates. One of synchronous memory devices in which data input/output is performed in synchronization with a clock signal is a memory device referred to as a synchronous DRAM (Dynamic Random Access Memory; referred to as SDRAM hereinafter).

FIG. 30 is a timing chart for a case where data is read in an SDRAM. An operating mode of the SDRAM is designated by a combination of states of a plurality of external control signals and such a combination of states of the plurality of control signals is indicated as a command. The SDRAM takes in the external control signals in synchronization with a leading edge (a rising) of a clock signal CLK such as a system clock to identify the designated operating mode. In FIG. 30, a read command to instruct reading of data is applied. Prior to the application of the read command, an active command has been applied, a row of memory cells have been internally selected and data of the memory cells of the selected row have been latched by sense amplifiers in the SDRAM. When a clock cycle(s) referred to as CAS latency have elapsed after application of a read command, valid data is output. FIG. 30 shows the reading of data where the CAS latency is three. That is, when a read command is applied in a clock cycle 0 and then three clock cycles have elapsed, external read data Q0 is output in synchronization with the rising of the clock signal CLK in a clock cycle 3. Read data Q0 is sampled in synchronization with this rising of the clock signal CLK to allow accurate data transfer.

In SDRAMs, when a CAS latency has elapsed, a predetermined number of data are successively read out in synchronization with a clock signal CLK. The number of data successively read out by one read command is referred to as burst length. FIG. 30 shows the data read operation where the burst length is four and data Q1, Q2 and Q3 are output in clock cycles 4, 5 and 6, respectively.

That number of clock cycles which is referred to as CAS latency is required between application of a read command and initial output of valid data. When the CAS latency has elapsed, however, data can be read out in synchronization with the clock signal CLK and fast data transfer (transfer of read data to the microprocessor) can be achieved. In writing data also, when a write command instructing a data write operation is applied, external written data is written into the SDRAM from the clock cycle in which the write command is applied.

The structure of the memory cell array of an SDRAM is the same as that of the memory cell array of the standard DRAM. That is, the memory cell array includes a plurality of memory cells arranged in a matrix, and the memory cells each have a one transistor/one capacitor type of dynamic type memory cell structure. A pair of bit lines is arranged corresponding to each column of memory cells, and a sense amplifier is provided corresponding to each pair of bit lines. When a read command which instructs reading of data is applied, data of a memory cell connected to a selected row has been read out on a corresponding column (a corresponding pair of bit lines) and has been sensed, amplified and latched by a sense amplifier in the memory cell array. A time period is required for transferring the data latched by the sense amplifier to an output buffer at an interface portion via which data is read out on a data input/output terminal (data input/output node). Reduction in this time period would lead to reduction in the cycle time of the clock signal CLK and thus fast data transfer is achieved. In order to achieve fast transfer of internal read data, the data transfer path from the sense amplifier to the output buffer can be divided into a plurality of pipeline stages so that data is transferred in a pipelining manner.

FIG. 31A schematically shows the configuration of the data read portion of an SDRAM having such pipeline stages. In FIG. 31A, one bit line pair BLP and a sense amplifier SA provided for the bit line pair BLP are representatively shown in the memory cell array portion. When activated, sense amplifier SA differentially amplifies and latches potentials of the bit lines of the corresponding bit line pair BLP.

The data read circuitry includes: a column address buffer CAB for incorporating an external address signal in synchronization with a clock signal CLK to produce an internal column address signal; a column decoder CD for decoding an internal column address signal from column address buffer CAB to produce a column select signal CSL for designating a column of the memory cell array; a column select gate IOG provided corresponding to a bit line pair BLP and turned on when a column select signal from column decoder CD designates a corresponding column (a corresponding bit line pair BLP) to electrically connect the corresponding bit line pair BLP to an internal I/O line pair IOP; a preamplifier PA for amplifying data on the internal I/O line pair IOP; and a latch LA1 for latching the data amplified by preamplifier PA.

Clock signal CLK is an internal clock signal which synchronizes with an externally applied clock signal extCLK. Column decoder CD is activated when an access command which instructs writing or reading of data into or from a memory cell, such as a read command or write command, is applied, and performs decoding operation. Preamplifier PA is activated and performs amplifying operation on reading data. Latch LA1 latches and outputs internal read data supplied from preamplifier PA.

The data read circuitry further includes: a clocked inverter CIV1 selectively conducting in response to complementary internal clock signals CLK and /CLK for inverting and transmitting data RD1 latched by latch LA1; a latch LA2 for latching and outputting an output signal from clocked inverter CIV1; a clocked inverter CIV2 activated in response to internal clock signals CLK and /CLK for inverting and outputting data RD2 latched and output by latch LA2; a latch LA3 for latching output data from clocked inverter CIV2; a clocked inverter CIV3 activated in response to internal clock signals CLK and /CLK for inverting and outputting output data RD3 from latch LA3; and an output buffer OB for buffering and outputting to an data input/output terminal the output data from clocked inverter CIV3.

The internal clock signal /CLK is an inverted version of the internal clock signal CLK. Clocked inverters CIV1 and CIV3 are activated in synchronization with each other when the clock signal CLK attains a high level. Clocked inverter CIV2 is activated complementarily to the clocked inverters CIV1 and CIV3 when the internal clock signal CLK attains a low level. Clocked inverters CIV1–CIV3 are each set to an output high impedance state when they are inactivated.

In the data transfer path from sense amplifier SA to output buffer OB shown in FIG. 31A, the output portion of sense amplifier SA to latch LA1, clocked inverter CIV1 and latch LA2, and clocked inverter CIV2 and latch LA3 function as the first pipe line stage STG1, the second pipeline stage STG2a and the third pipeline stage STG3, respectively, and output buffer OB operates as the fourth pipeline stage STG2b. Now, the operation of the data read circuitry of the SDRAM shown in FIG. 31A will be described with reference to a operation timing chart thereof shown in FIG. 31B.

At time t1, a read command READ which instructs reading of data is externally applied. In a state prior to the application of the read command READ, sense amplifier SA has been activated and it has sensed, amplified and latched data of a memory cell read out on a corresponding bit line pair BLP. A column address is applied simultaneously with the read command READ, and column address buffer CAB incorporates the external address signal in synchronization with the internal clock signal CLK to produce an internal column address signal. Column decoder CD decodes the internal column address signal from column address buffer CAB and activates a column select signal CSL which designates an addressed column. A column select gate IOG provided corresponding to the column addressed by the column address signal is turned on in response to the column select signal CSL and electrically connects the corresponding bit line pair BLP to a internal I/O line pair IOP. This allows memory cell data latched by sense amplifier SA to be transmitted to the internal I/O line pair. Latched data of sense amplifier SA transmitted to the internal I/O line pair IOP is amplified by preamplifier PA and latched by latch LA1, and output data RD1 from latch LA1 is set to a state corresponding to the data of the selected memory cell. It takes one clock cycle to transfer data from sense amplifier SA to latch LA1.

When an external clock signal extCLK rises at time t2, the internal clock signal CLK output from a clock buffer (not shown) rises, clocked inverter CIV1 is activated (conducts), data RD1 latched in latch LA1 is transmitted to latch LA2, and the latched data RD2 in latch LA2 changes to correspond to the latched data RD1 of latch LA1. The clock signal CLK attains a high level, and clocked inverter CIV is inactivated and is set to an output high impedance state. When the internal clock signal CLK falls to a low level, clocked inverter CIV2 is activated, data RD2 latched in latch LA2 is transmitted to latch LA3, and output data RD3 in latch LA3 is transmitted to output buffer OB. Output buffer OB buffers the data supplied via clocked inverter CIV3 and outputs valid read data DQ to the data input/output node.

Pipeline stage STG1 requires one clock cycle for data transfer. Pipeline stages STG2a and STG2b each require half a clock cycle for data transfer, and data is transmitted from pipeline stage STG2b via clocked inverter CIV3 to output buffer OB. In the data read circuitry, thus, pipeline stage STG1 constitutes a pipeline stage of one clock cycle, pipeline stages STG2a and STG2b constitute a pipeline stage of one clock cycle, and pipeline stage STG3 of clocked inverter CIV3 and output buffer OB constitutes a pipeline stage of one clock cycle.

Thus, it normally takes three clock cycles to transfer data from the sense amplifier to output buffer OB. These stages can operate in parallel in transferring data in a pipelining manner. Referring to FIG. 31B, in each clock cycle, the column select signal CSL is activated in response to a rising of the internal clock signal CLK to successively select columns and transmit new data to preamplifier PA and the new data are amplified therein.

Assume that it takes 30 ns to transfer data from sense amplifier SA to output buffer OB. When data is transferred from sense amplifier SA to output buffer OB within one clock cycle, the operating frequency limit is $1/30$ ns=33 MHz. On the other hand, with the pipeline configuration shown in FIG. 31A, data transfer per a pipe line stage of one clock cycle requires $1/3$ clock cycle, and hence requires 30 ns/3=10 ns and this allows data to be output at 100 MHz.

Thus, the data read path mentioned above is configured in a pipeline and internal read data is transferred to an output buffer synchronously with an internal clock signal in a pipelining manner to allow increased operating frequency and fast data transfer.

As shown in FIG. 31B at time t3, the time required between rising of the external clock signal extCLK to a high level and appearance of valid data Q on the data input/output terminal is referred to as a clock access time tAC. It is extremely important in constructing fast memory system to reduce the clock access time tAC. The reason for this will be described below.

FIG. 32A schematically shows a configuration of a general processing system. In FIG. 32A, a memory controller MCTL and a memory module MM are arranged on a printed circuit board PCB. Memory module MM internally includes a plurality of SDRAMs M#1–M#n. Each of these SDRAMs M#1–M#n has the configuration of the data read portion shown in FIG. 31A and inputs/outputs data in synchronization with a clock signal applied. A plurality of SDRAMs M#1–M#n are provided within module MM in parallel so that the number of output data bits of memory module MM can be larger than that of an SDRAM and thus fast data transfer can be achieved. In memory module MM, all of SDRAMs M#1–M#n may be accessed simultaneously, or a predetermined number of SDRAMs among SDRAMs M#1–M#n may be simultaneously activated depending on the address space of memory module MM. Simultaneously activated SDRAMs perform reading or writing of data in parallel.

Memory controller MCTL accesses memory module MM according to an access request from a microprocessor (or a CPU) (not shown) and data is transferred between memory module MM and the microprocessor (or the CPU) (not shown) via memory controller MCTL.

Memory module MM has a plurality of data input/output pins DQPs, and a clock input pin CIP for receiving a clock signal CLKa applied from memory controller MCTL via an interconnection line PIc on the printed circuit board. The clock signal CLKa applied to clock input pin CIP is buffered by a clock input buffer CB within the memory module MM and commonly applied to SDRAMs M#1–M#n. A clock signal output from clock input buffer CB corresponds to the external clock signal extCLK previously shown in FIG. 31B. Memory controller MCTL is coupled to data input/output pins DQPs of memory module MM via an interconnection line PId on the board, and inputs/outputs data. Assume that the memory controller MCTL applies a clock signal CLKa such as a system clock and required data is read from memory module MM.

In memory module MM, an activated SDRAM among SDRAMs M#1–M#n is triggered by the clock signal applied by a clock input buffer CB and outputs data. The data from the activated SDRAM within memory module MM is supplied to memory controller MCTL via data input/output pin DQP (in FIG. 32A, a data input/output pin DQP provided for an SDRAM M#1 is representatively shown) and interconnection line PId on the printed circuit board. The delay time of data with respect to the clock signal CLKa seen from memory controller MCTL will now be described with reference to FIG. 32B.

In FIG. 32B, TC is one clock cycle time, that is, the period, of the clock signal CLKa. A time T0 is a propagation delay in interconnection line PIc until the clock signal CLKa reaches clock input pin CIP of memory module MM from memory controller MCTL. It requires a time T1 to transmit the clock signal from clock input pin CIP via clock input buffer CB at a clock input terminal of an SDRAM in memory module MM. Since a clock skew T2 until the clock signal is defined on the clock input pin in the SDRAM is taken into consideration, the time T2 is added as a delay time. In the SDRAMs (M#1–M#n), a clock access time tAC is required between the initiating of data read operation according to the clock signal input to the clock input pin (clock input node) and the outputting of valid data on data input/output pin DQP. A time T3 is required for transmitting the valid data from data input/output pin DQP via interconnection line PId to memory controller MCTL. Since memory controller MCTL takes valid data in synchronization with a rising of the clock signal CLKa, a set up time T4 is required for holding the valid data in a defined state prior to the rising of the clock signal CLKa. Thus, in order to transmit valid data from memory module MM to memory controller MCTL within one clock cycle of the clock signal CLKa, the following condition should be satisfied:

$$tAC<TC-T0-T1-T2-T3-T4.$$

For example, in a system in which the clock signal CLKa is 100 MHz, when TC=10 ns, T0=1 ns, T1=1 ns, T2=1 ns, T3=1 ns and T4=2 ns, the clock access time tAC should satisfy the following condition according to the above expression:

$$tAC<4 \text{ ns}.$$

On the other hand, referring to FIGS. 31A and 31B, the clock access time tAC in the SDRAM is a delay time tCD of the internal clock signal CLK relative to the external clock signal extCLK plus a delay time taken for outputting valid data from clocked inverter CIV3 via output buffer OB to the data input/output node, that is, a delay time tRD, a delay time of clocked inverter CIV3 added to a delay time of output buffer OB. In a typical example, tCD=1.5 ns and tRD=4 ns. Accordingly the clock access time tAC is 5.5 ns so that the value of 4 ns required when the clock signal of 100 MHz mentioned above is used cannot be obtained.

Clocked inverter CIV3 and output buffer OB each have an inherent delay time so that reduction in the delay time tRD is limited. Furthermore, reduction of the delay time tCD of the internal clock signal CLK is not easy, as described below.

FIG. 33 schematically shows the configuration of a clock input buffer circuit which generates an internal clock signal intCLK (CLK) from an external clock signal extCLK. In FIG. 33, the clock input buffer circuit includes a CKE buffer circuit CEB which receives an external clock signal extCLK and an external clock enable signal extCKE to produce an internal clock enable signal CKE, and a clock input buffer CIB which receives the internal clock enable signal CKE and the external clock signal extCLK to produce an internal clock signal intCLK. CKE buffer circuit CEB takes in the external clock enable signal extCKE at a rising of the external clock signal extCLK and outputs the internal clock enable signal CKE. CKE buffer circuit CEB sets the internal clock enable signal CKE to an active high level when the external clock enable signal extCKE attains an active high level. When the external clock enable signal extCKE attains an inactive low level, CKE buffer circuit CEB inactivates the internal clock enable signal CKE for one clock cycle period from the rising of the external clock signal extCLK in the cycle.

Clock input buffer CIB includes an NAND circuit G which receives the external clock signal extCLK and the internal clock enable signal CKE, and five-stage cascaded inverter circuits IV1–IV5. Inverter circuit IV1 receives an output signal from NAND circuit G. When the internal clock enable signal CKE attains an low level, the output signal from NAND circuit G attains a high level independently of the level of the external clock signal extCLK and the internal clock signal intCLK attains a low level. Thus, when the internal clock enable signal CKE attains a low level, generation of the internal clock signal intCLK (driving thereof to a high level) is stopped. When the internal clock enable signal CKE attains a high level, NAND circuit G acts as an inverter circuit to invert the external clock signal extCLK.

The internal clock signal intCLK from clock input buffer CIB defines internal operation timings of the SDRAM and is applied to various circuits. That is, the internal clock signal intCLK determines command decoding timing, the timing of taking external control signals and an address signal, data input/output timing, and the like. Thus, the internal clock signal intCLK from clock input buffer CIB is applied to a number of circuit portions so that the output load of clock input buffer CIB is, for example, as great as 3 pF.

Clock input buffer CIB is provided with the multistage inverter circuits IV1–IV5 to drive such a large output load at high speed. That is, inverter circuits IV1–IV5 have the output driving capability increased sequentially due to the following reason, to each drive the circuit at the subsequent stage at high speed for reduction in signal propagation delay: when inverters IV1–IV5 configure one stage, for example, one inverter circuit is required to drive large output load. This increases the gate capacitance of the inverter circuit so that the input portion of the inverter circuit cannot be changed at high speed, resulting in further delay. In order to reduce such a delay, the driving capabilities are sequentially increased to propagate a signal. However, since multistage inverter circuits are required, the value of the totaled delay times of the inverter circuits is innegligibly large and thus the delay time tCD in clock input buffer CIB is not readily reduced.

Thus, in the configuration where the data read path is configured as a pipeline to achieve fast data transfer, as shown in FIG. 31A, even when output RD3 of latch LA3 is valid, the clock access time tAC cannot be reduced, since the timing at which clocked inverter CIV3 is activated is delayed.

FIG. 34 shows a valid period of external read data Q. In FIG. 34, the read data Q is defined in an elapse of the clock access time tAC after a rising of the external clock extCLK. Since the output data Q is taken into the memory controller at the next rising of the external clock signal CLK, the output data Q need be kept in a valid state for a time referred to as hold time tOH in order to ensure that the data is taken into the memory controller. In FIG. 34, skew is caused in the timing at which the read data Q is defined depending on the operating conditions of the SDRAM. The clock access time tAC and the valid data hold time tOH are determined according to the values of the worst conditions, respectively. Both the clock access time tAC and the valid data hold time tOH are defined with reference to rising edges of the external clock signal extCLK. The output buffer receives internal read data according to an internal clock signal which synchronizes with the external clock signal extCLK, and transmits the output data Q to the data input/output node at high speed when the clock access time tAC is short, in which case data is switched at high speed and the valid data hold time tOH is reduced. Ideal values of the clock access time tAC and valid data hold tOH are varied depending on the system which employs an SDRAM. Shorter clock access time tAC is important for the system in which the operating frequency is higher and the signal propagation delay (T0+T1+T2+T3; see FIG. 32B) between memory controller MCTL and the SDRAM (or memory module MM) occupies a larger portion of the clock cycle time TC. On the other hand, longer valid data hold time tOH is important for the system in which the operating frequency is relatively low and the signal propagation delay between the memory controller and the SDRAM (or memory module MM) occupies a smaller portion of the clock cycle time TC (to ensure that data is taken in).

In a conventional SDRAM or memory module, however, data output is only performed synchronously with one external signal extCLK and thus the relation between the clock access time tAC and the valid data hold time tOH is determined almost uniquely and cannot be adjusted depending on the system applied.

SUMMARY OF THE INVENTION

An object of the present invention is to provide a synchronous semiconductor memory device capable of operating at high speed.

Another object of the present invention is to provide a synchronous semiconductor memory device in which the clock access time is reduced without increasing chip area nor power consumption.

Still another object of the present invention is to provide a synchronous semiconductor memory device in which the clock access time and the valid data hold time can be adjusted according to a processing system applied.

In summary, a synchronous semiconductor memory device according to the present invention includes a node for receiving a clock signal which provides a timing at which external control signals and an address signal are taken in, and a clock input node for receiving a clock signal which determines data output timing, separately. These clock input nodes externally receive clock signals phases of which are different from each other.

Since clock signals phases of which are different from each other are used in a synchronous semiconductor memory device to take in control signals and an address signal and to output data, data output timing can be adjusted with respect to the timing of taking in external control signals and an address signal, and the clock access time and the valid data hold time can be adjusted according to a processing system applied.

Furthermore, since the phase of the clock signal for outputting data is set earlier than that of the clock signal for taking control signals and an address signal, the delay time in the output buffer stage is effectively reduced and the clock access time is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a timing chart illustrating operations of the circuits shown in FIG. 6.

FIG. 31A shows a configuration of possible pipeline states for fast transfer of internal read data of an SDRAM and FIG. 31B is a timing chart illustrating an operation thereof.

FIG. 33 shows a configuration of an internal clock generating portion of a conventional SDRAM.

FIG. 34 is a diagram for illustrating clock access time and data hold time in the general SDRAMs.

DESCRIPTION OF THE PREFERRED EMBODIMENTS

[First Embodiment]

Figure 1:
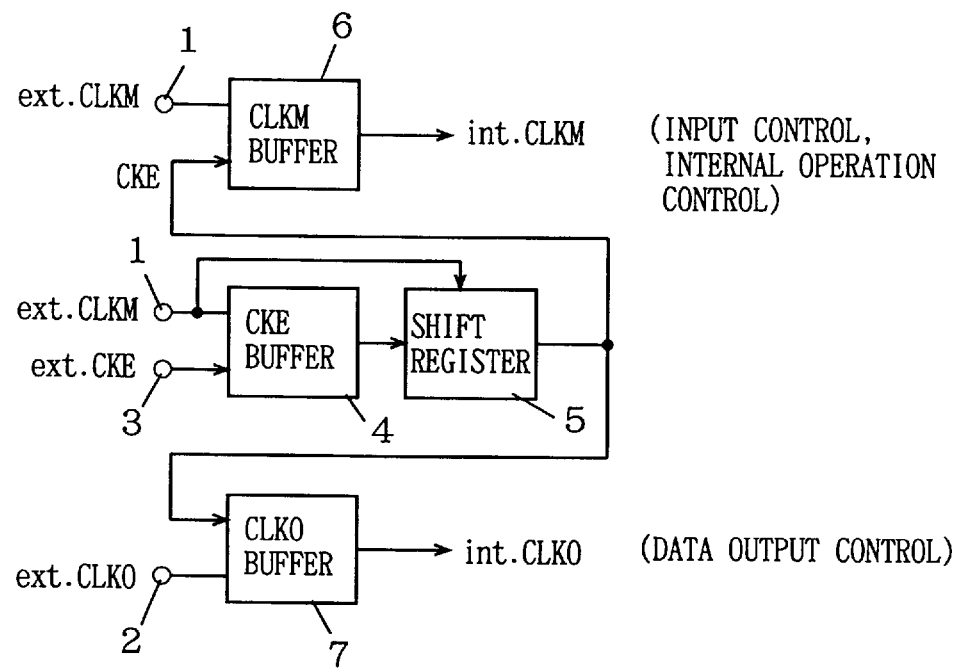
FIG. 1 schematically shows a configuration of a clock signal input portion of a synchronous semiconductor memory device according to a first embodiment of the present invention.

FIG. 1 schematically shows a configuration of an internal clock generation portion of an SDRAM according to a first embodiment of the present invention. In FIG. 1, the internal clock generation portion receives an external master clock signal extCLKM to a first clock input node 1 corresponding to a first clock signal input, and a clock signal extCLKO for external output at a second clock input node 2 as a second clock signal input, and outputs an internal master clock signal intCLKM and an clock signal intCLKO for internal output. The internal master clock signal intCLKM is used for internal operation control such as latching of externally applied control signals and an address signal, operation timing of an internal circuit (triggering of a counter, which will be described later) or the like. The clock signal intCLKO for internal output is used only for timing control with respect to outputting of internal read data to the outside of the device.

The internal clock generation portion includes: a CKE buffer 4 receiving the external master clock signal extCLKM input to clock input node 1 and an external clock enable signal extCKE input to an input node 3, and taking the external master clock enable signal extCKE at a rising edge of the external master clock signal extCLKM; a shift register 5 for shifting an output signal of CKE buffer 4 in synchronization with the external master clock signal CLKM to output an internal clock enable signal CKE; a CLKM buffer 6 outputting the internal master clock signal intCLKM in response to the external master clock signal extCLKM and the internal clock enable signal CKE; and a CLKO buffer 7 outputting the clock signal intCLKO for internal output in response to the internal clock enable signal CKE and the clock signal extCLKO for external output.

Figure 2:
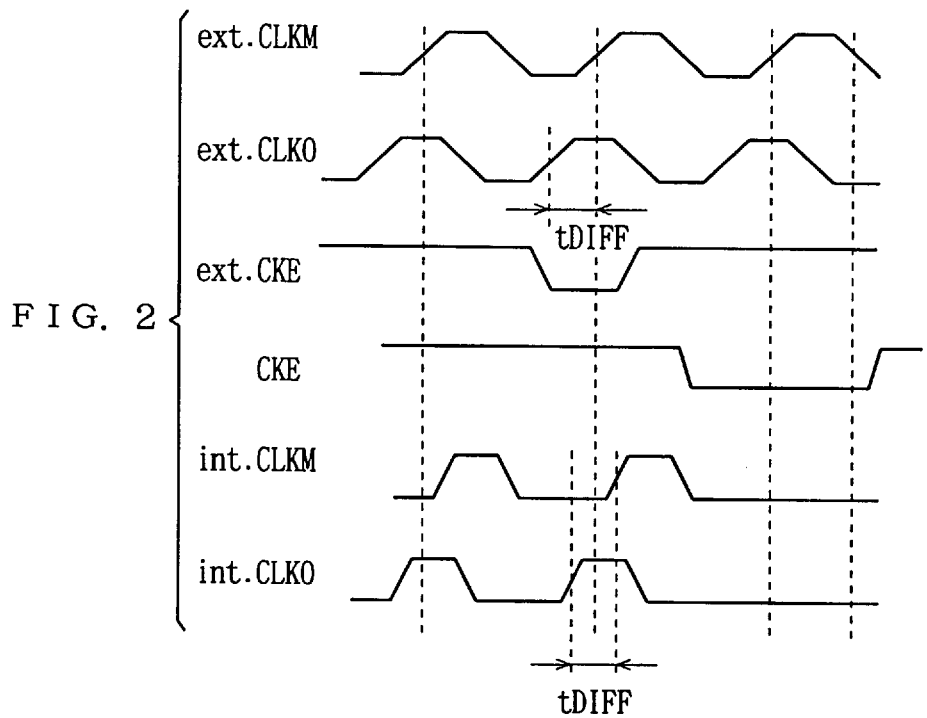
FIG. 2 is a signal waveform diagram illustrating an operation of the clock signal input portion shown in FIG. 1.

When the external master clock enable signal extCKE attains a low level at a rising of the external master clock signal extCLKM, CKE buffer 4 and shift register 5, the configurations of which will be described in detail later, set the internal clock enable signals CKE at a low level for one clock cycle from the falling of the external clock signal extCLKM. CLKM buffer 6 and CLKO buffer 7 have a same configuration, and produce the internal clock signals intCLKM and intCLKO according to the externally applied clock signals extCLKM and extCLKO when the internal clock enable signal CKE attains an active high level. When the internal clock enable signal CKE attains a low level, CLKM buffer 6 and CLKO buffer 7 hold the internal clock signals intCLKM and intCLKO at low level. The operation of the internal clock generating portion shown in FIG. 1 will now be described with reference to the timing chart shown in FIG. 2.

The phase of clock signal extCLKO for external output is in advance of that of the external master clock signal extCLKM. A phase difference (time difference) tDIFF between the clock signal extCLKO for output and the external master clock extCLKM is, for example, 1.5 ns. This value is equal to the delay time tCD of the internal clock signal previously described. When the internal clock enable signal CKE attains a high level, CLKM buffer 6 and CLKM buffer 7 produce the internal clock singals intCLEM and intCLKO according to the externally applied clock signals extCLKM and extCLKO, respectively. CLKM buffer 6 and CLKM buffer 7 have a same configuration and a same delay time (the internal configuration thereof will be described later). Thus, the time difference between the clock signal intCLKO for internal output and internal master clock signal intCLKM is also tDIFF. That is, read data from the output buffer is output at a timing faster by the time tDIFF. Thus, the clock access time tAC is effectively reduced. When the internal clock enable signal CKE attains a low level, the internal clock signals intCLKM and intCLKO from CLKM buffer 6 and CLKO buffer 7 are not driven to high level and thus any new internal operation is not performed. The mechanism in which the external clock signals extCLKM and extCLKO the phases of which are different from each other are used to reduce the access time will be described later in detail. Here, the fact is briefly referred to that data output timing of the output buffer is advanced by the time tDIFF so that the clock access time tAC relative to the master clock signal extCLKM is reduced.

Figure 3A:
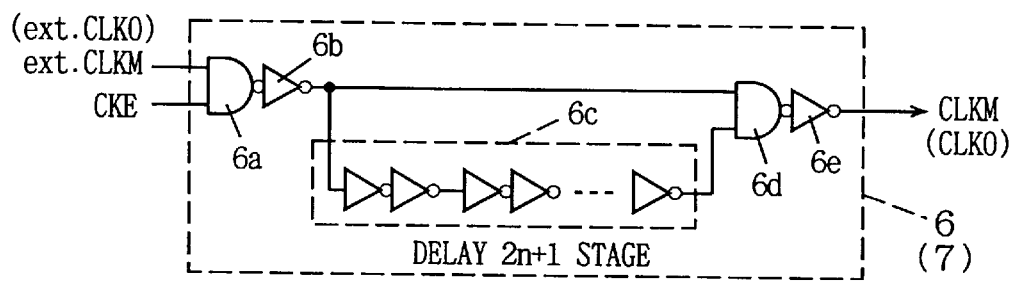
FIG. 3A shows one example of the configuration of the CLKM buffer and CLKO buffer shown in FIG. 1 and the FIG. 3B is a waveform diagram representing an operation thereof.

FIG. 3A shows the configuration of CLKM buffer 6 and CLKO buffer 7 shown in FIG. 1. In FIG. 3A, the configuration of CLK buffer 6 is shown, since CLKO buffer 6 and CLKM buffer 7 have a same configuration. The configuration of CLKO buffer 7 is obtained by replacing the master clock signals extCLKM and CLKM (intCLKM) with the clock signals extCLKO and CLKO (intCLKO) for output, respectively.

Figure 3B:
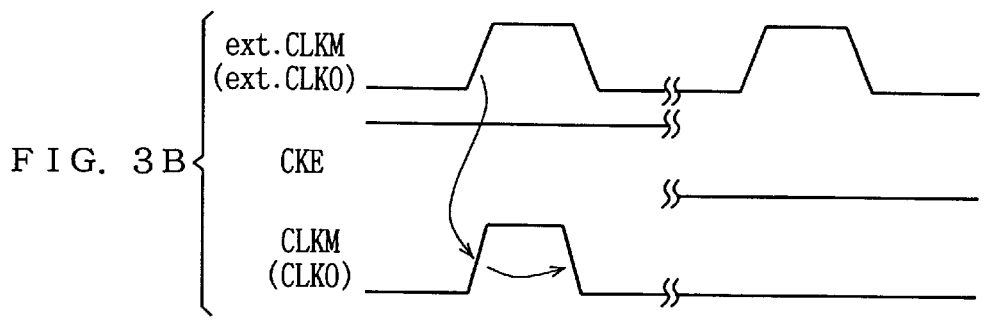

In FIG. 3A, CLKM buffer 6 includes an NAND circuit 6a receiving the external master clock signal extCLKM and the internal clock enable signal CKE, an inverter circuit 6b for inverting an output signal of NAND circuit 6a, a delay circuit 6c for inverting and delaying by a predetermined time an output signal of inverter circuit 6d, an NAND circuit 6d receiving an output signal of delay circuit 6c and an output signal of inverter 6b, and an inverter circuit 6e for inverting an output signal of NAND circuit 6d to produce the internal mask clock signal CLKM. Delay circuit 6c is configured by an odd number of stages of inverters. The operation of the CLKM buffer shown in FIG. 3A will now be described with reference to an operation waveform diagram thereof shown in FIG. 3B.

When the internal clock enable signal CKE attains a high level, NAND circuit 6a acts as an inverter and inverter circuit 6b outputs a buffered, external master clock signal extCLKM. When the output signal of inverter circuit 6b rises, the output signal of NAND circuit 6d attains a low level since the output signal of delay circuit 6c is still at a high level, and the internal master clock signal CLKM output from inverter circuit 6e rises. When a delay time of delay circuit 6c elapses, the output signal of delay circuit 6c attains an low level and the internal master clock signal CLKM falls to a low level. Thus, when a high level period of the external mask clock signal extCLKM is larger than the delay time of delay circuit 6c, the internal master clock signal CLKM from CLKM buffer 6 has its high-level pulse width rendered constant. Thus, even when the pulse width of the external clock signal extCLKM is increased due to clock skew, the pulse width of the clock signal CLKM can be constant internally, the timing at which a circuit operating synchronously with a falling of the internal clock signal CLKM starts to operate can be fixed, timing margin need not be taken into consideration and thus fast internal operation can be achieved.

When the internal clock enable signal CKE attains a low level, the output signal of NAND circuit 6a attains a high level and the output signal of inverter circuit 6b attains a low level. Thus, the output signal of NAND circuit 6d attains a high level and the internal master clock signal CLKM attains a low level. By using the internal clock enable signal CKE, the state in the previous clock cycle is maintained in the SDRAM and any new internal operation is not performed, so that charging/discharging of signal lines is not performed and thus reduction in current consumption and adjustment of data sampling timing of an external processing device in successive data outputting can be achieved.

Figure 4A:
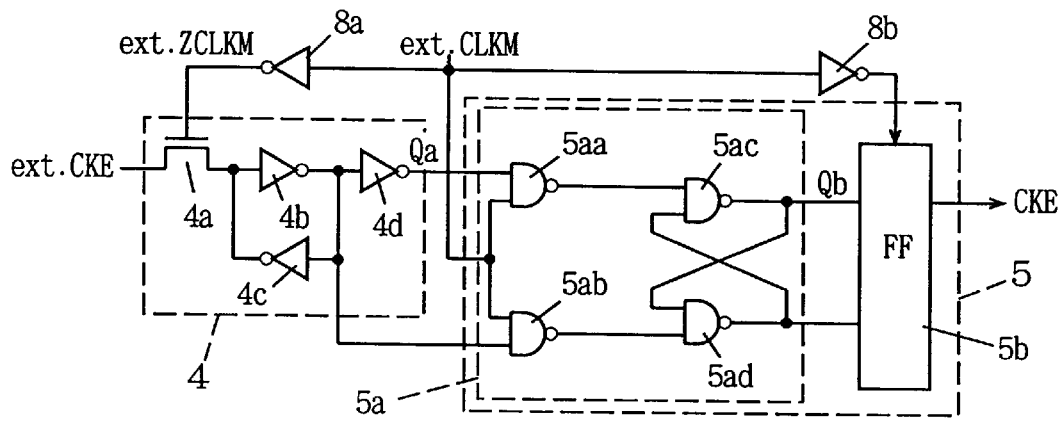
FIG. 4A shows one example of the configuration of the CLKM buffer and shift register shown in FIG. 1

FIG. 4A shows one example of the configurations of CKE buffer 4 and shift register 5 shown in FIG. 1. In FIG. 4A, CKE buffer 4 includes a transfer gate 4a configured, for example, by an n channel MOS transistor conducting in response to a signal extZCLKM, an inverted version of the external master clock signal extCLKM and applied via an inverter circuit 8a, and passing the external clock enable signal extCKE, an inverter circuit 4b for inverting a signal supplied via transfer gate 4a, an inverter circuit 4c for inverting an output signal of inverter circuit 4b for supplying to an input portion of inverter circuit 4b, and an inverter circuit 4d for inverting an output signal of inverter circuit 4b. Inverter circuits 4b and 4d supply signals complementary to each other to shift register 5.

Shift register 5 includes two-stage register circuits 5a and 5b. Register circuit 5a includes an NAND circuit 5aa receiving the external master clock signal extCLKM and an output signal Qa from inverter circuit 4a of CKE buffer 4, an NAND circuit 5ab receiving an output signal of inverter circuit 4b and the external master clock signal extCLKM, an NAND circuit 5ac receiving at its one input an output signal of NAND circuit 5aa, and an NAND circuit 5ad receiving an output signal of NAND circuit 5ab and an output signal of NAND circuit 5ac. An output signal of NAND circuit 5ad is input to the other input of NAND circuit 5ac. NAND circuit 5ac and 5ad form a flipflop.

Register circuit 5b has the same configuration as register circuit 5a except that it receives the in complementary external master clock signal extZCLKM from an inverter circuit 8b instead of the external master clock signal extCLKM. Inverter circuits 8a and 8b may be made common. Now, the operations of CKE buffer 4 and shift register 5 shown in FIG. 4A will be described with reference to a timing chart thereof shown in FIG. 4B.

When the external master clock signal extCLKM attains a low level, the complementary external master clock signal extZCLKM attains a high level. In CKE buffer 4, transfer gate 4a is turned on to pass the external clock enable signal extCKE and the signal extCKE is latched by a latch circuit formed of inverters 4b and 4c. In register circuit 5a, when the external master clock signal extCLK attains a low level, the output signals of NAND circuits 5aa and 5ab attain high level and the state of the output signal Qb is not changed. Register circuit 5b latches and outputs the output signal Qb from register circuit 5a as the internal clock enable signal CKE.

At time t0, when the external master clock signal extCLKM rises to a high level, transfer gate 4a in CKE buffer 4 is turned off and CKE buffer 4 is set to a latching state. "A latching state" herein means the state in which the state of an output signal does not change even when the state of the input signal changes. The external clock enable signal extCKE attains a high level and the output signal Qa attains a high level. In register circuit 5a, the output signal of NAND circuit 5aa attains a low level according to the high level output signal Qa and the high level external master clock signal extCLKM and the output signal Qb is held at the high level. Register circuit 5b is in a latching state.

At time t1, when the external clock enable signal CKE is set to a low level at a rising of the external master clock signal extCLKM, CKE buffer 4 latches the low level external clock enable signal extCKE supplied when transfer gate 4a is turned on, and is set to a latching state. Register circuit 5a is set to a through state in response to the rising of the external clock master signal extCLKM. "A through state" herein means the state in which an input signal applied is latched and is output, and means the state in which an output signal changes according to the state of the input signal. The output signal of NAND circuit 5aa attains a high level, the output signal of NAND circuit 5ab attains a low level, and the output signal of NAND circuit 5ad attains a high level. Thus, the signal Qb from NAND circuit 5ac attains a low level. The complementary master clock signal extZCLK output by inverter circuit 8b attains a low level, register circuit 5b is in a latching state, and the state of the clock enable signal CKE is not changed and is thus held at the high level.

At time t2, when the external master clock signal extCLKM falls to a low level, transfer gate 4a is turned on and the output signal Qa from CKE buffer 4 attains a high level according to the external clock enable signal extCKE which has returned to a high level. In register circuit 5a, the output signals of NAND circuits 5aa and 5ab attains high level and the state of the output signal Qb does not change. Register circuit 5b is set to a through state according to a high level of complementary clock signal extZCLKM supplied from inverter circuit 8b, and the internal clock enable signal CKE attains a low level.

At time t3, when the external master clock signal extCLKM attains a high level, register circuit 5a incorporates the high level signal Qa from the CKE buffer 4 and the output signal Qb attains a high level. In this state, register circuit 5b is in a latching state and the internal clock enable signal CKE is held at the low level.

At time t4, when the external master clock signal extCLKM attains a low level, register circuit 5a is set to a latching state, register circuit 5b is set to a through state, and the internal clock enable signal CKE attains a high level according to the signal Qb.

Figure 4B:
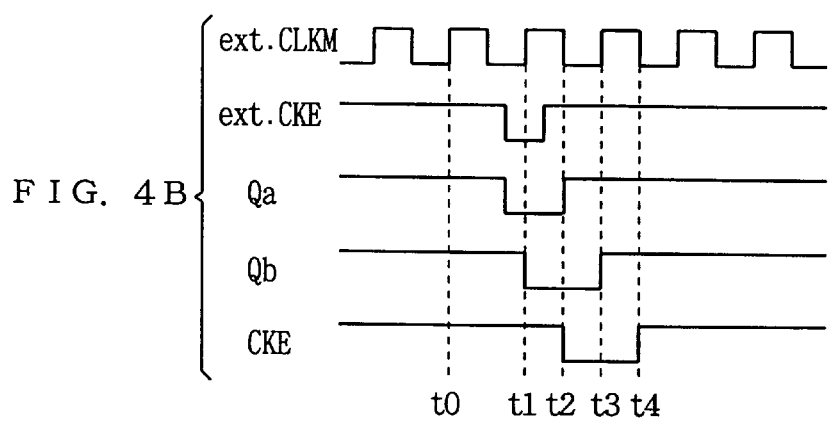
FIG. 4B is a timing chart illustrating an operation thereof.

Thus, as seen in the timing chart shown in FIG. 4B, when the external clock enable signal extCKE attains an inactive low level, the internal clock enable signal CKE attains an inactive low level for one clock cycle between time t2 and time t4, and thus activation of the internal master clock signal CLKM synchronized with the rising of extCLKM to a high level at time t3 is stopped.

In the configuration shown in FIG. 4A, register circuits 5A and 5B may be configured using an inverter latch, as is in CKE buffer 4.

Furthermore, in CKE buffer 4, transfer gate 4a may configured by a clocked inverter.

Figure 5:
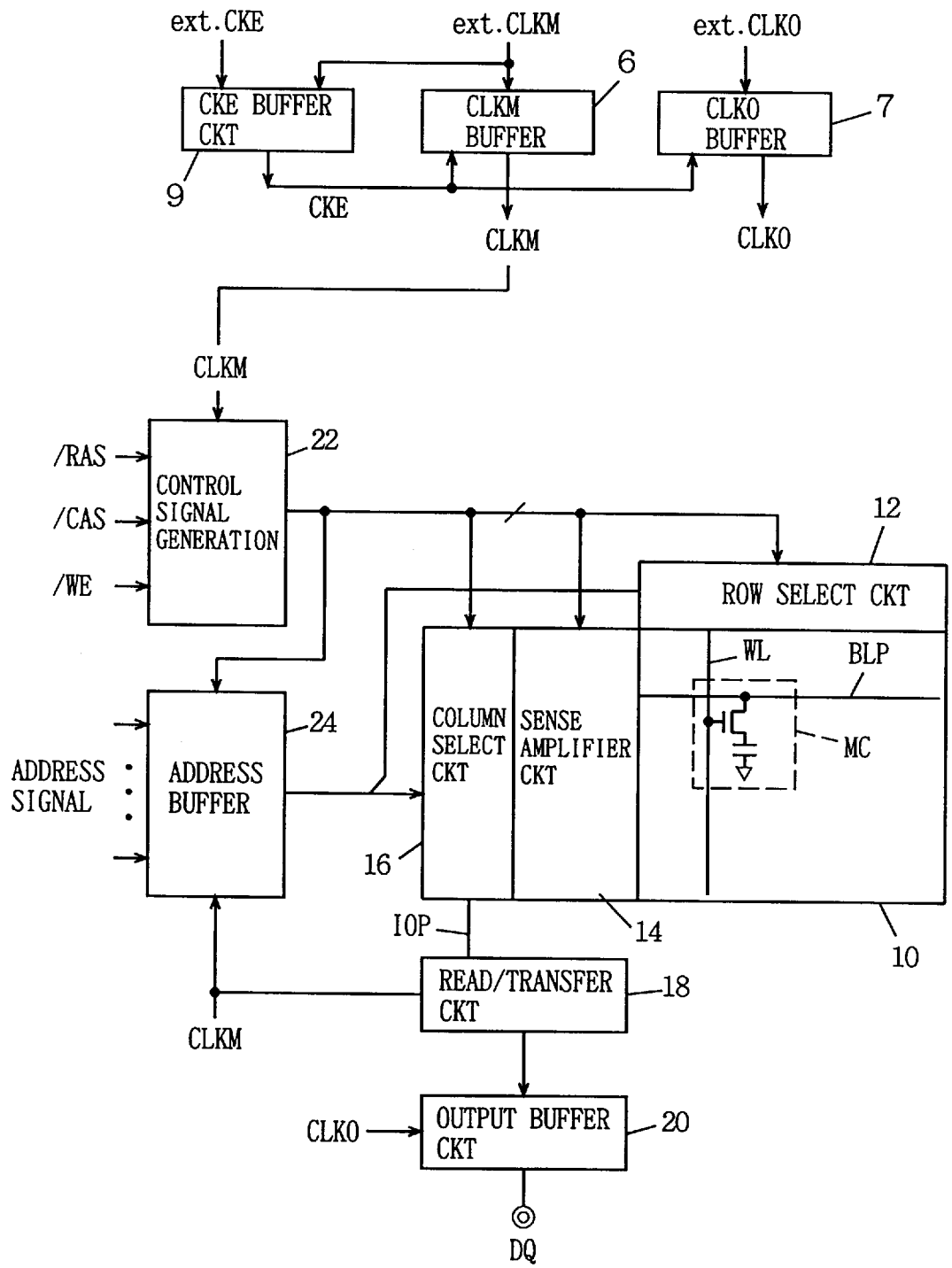
FIG. 5 schematically shows the entire configuration of an SDRAM according to the present invention.

FIG. 5 schematically shows the entire configuration of an SDRAM according to the present invention. In FIG. 5, a CKE buffer circuit 9 includes CKE buffer 4 and shift register 5 shown in FIG. 1. CLKM buffer 6 and CLKO buffer 7 are the same as those shown in FIG. 1.

The SDRAM also includes a memory cell array 10 having a plurality of memory cells MCs arranged in a matrix, a row select circuit 12 for driving a word line of memory cell array 10 addressed according to an internal row address signal applied into a selected state, a sense amplifier circuit 14 for sensing, amplifying and latching data of memory cells connected to the selected row of memory cell array 10, and a column select circuit 16 connecting to an internal I/O line pair IOP a bit line pair BLP corresponding to an addressed column of memory cell array 10 according to an internal column address signal applied. Memory cell MC has a memory cell structure of one transistor/one capacitor type and is arranged corresponding to a cross portion of a word line WL and a bit line pair BLP.

Row select circuit 12 includes a decode circuit for decoding an internal row address signal applied, and a word line driving circuit for driving a word line corresponding to a row addressed according to an output signal of the decode circuit into a selected state. Sense amplifier circuit 14 includes a sense amplifier provided for each bit line pair BLP. Each of these sense amplifiers differentially amplifies and latches potentials of the bit lines of a corresponding bit line pair. Column select circuit 16 includes a decode circuit for decoding an internal column address signal to produce a column select signal, and a column select gate connecting a corresponding bit line pair (a sense amplifier) to internal I/O line pair IOP according to the column select signal.

The SDRAM further includes a read/transfer circuit 18 for amplifying data read out on internal I/O line pair IOP and transferring the amplified data according to the internal master clock signal CLKM, an output buffer circuit 20 taking the read data transferred via read/transfer circuit 18 for outputting to a data input/output node (DQ) synchronously with the clock signal CLKO for output, a control signal generating circuit 22 incorporating external control signals of a row address strobe signal /RAS, a column address strobe signal /CAS and a write enable signal /WE and identifying their states to produce an internal control signal according to the identified result, and an address buffer 24 incorporating an external address signal according to the internal master clock signal CLKM and the control signal from control signal generating circuit 22 to produce an internal row address signal and an internal column address signal.

Control signal generating circuit 22 may receive a chip select signal /CS. Control signal generating circuit 22 also controls operation timings of row select circuit 12, sense amplifier circuit 14 and of column select circuit 16. Row select circuit 12 corresponds to memory cell select means, and sense amplifier circuit 14, column select circuit 16 and a read circuit included in read/transfer circuit 18 correspond to internal read means. Output buffer circuit 20 corresponds to a first transfer gate and output buffer means.

Figure 6:
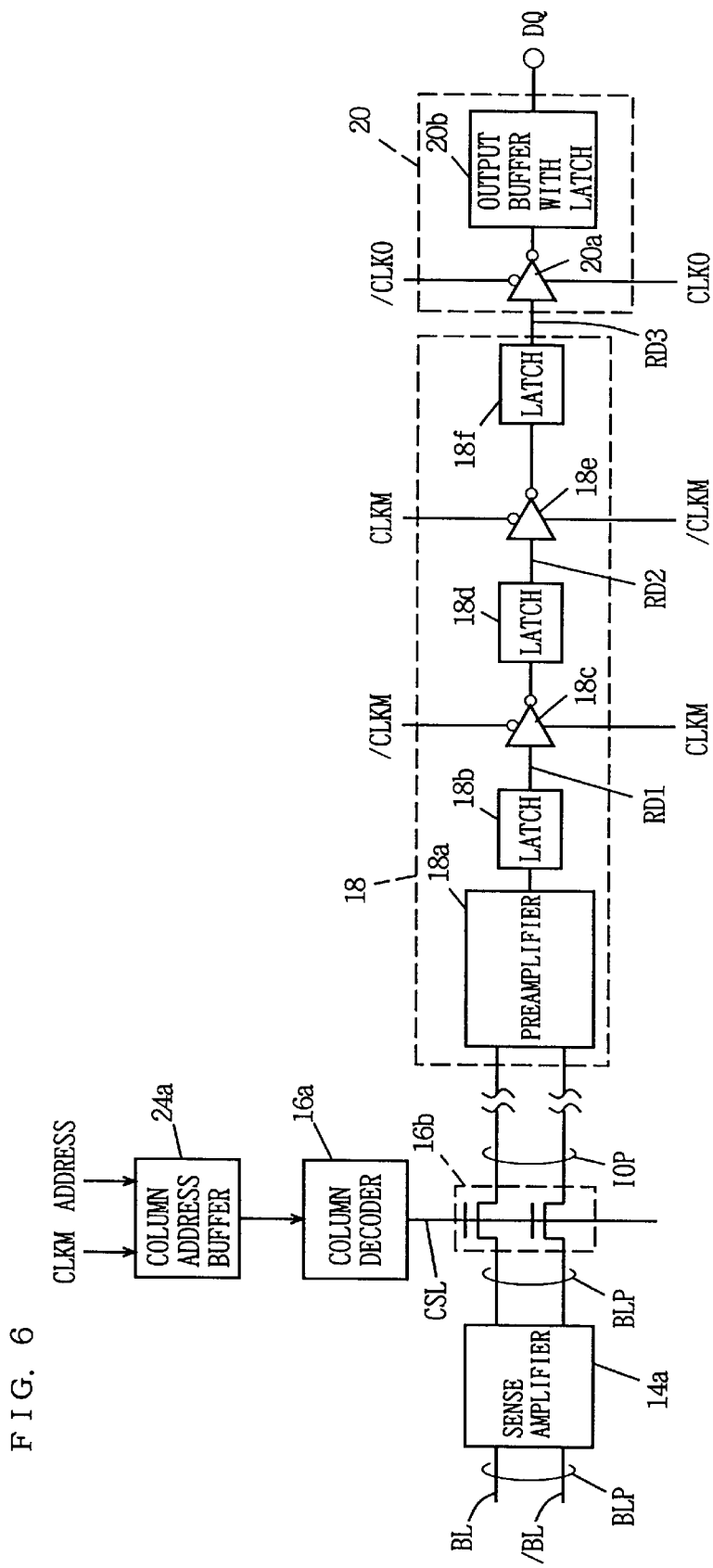
FIG. 6 shows a specific configuration of the column select circuit, read/transfer circuit and output buffer circuit shown in FIG. 5.

FIG. 6 schematically shows configurations of sense amplifier circuit 14, column select circuit 16, read/transfer circuit 16 and of output buffer circuit 20 of the SDRAM shown in FIG. 5. In FIG. 6, sense amplifier circuit 14 includes a sense amplifier 14a provided corresponding to each bit line pair BLP. Sense amplifier 14a differentially amplifies and latches signal potentials on the bit lines BL and /BL of a corresponding bit line pair BLP.

Column select circuit 16 includes a column decoder 16a for decoding an internal column address signal from a column address buffer 24a included in address buffer 24 to output a column select signal, and a column select gate 16b turned on in response to a column select signal CSL from column decoder 16a to electrically connect a bit line pair BLP to internal I/O line pair IOP.

Read/transfer circuit 18 includes a preamplifier 18a for amplifying and outputting signal potentials on internal I/O line pair IOP to an internal read data bus, a latch 18b for latching an output signal of preamplifier 18a, a clocked inverter 18c operating in response to the internal master clock signal CLKM and the complementary signal /CLKM, a latch circuit 18b for latching an output signal of clocked inverter 18c, a clocked inverter 18e activated in response to the internal master clock signals CLKM and /CLKM to invert an output signal of latch 18d, and a latch 18f for latching an output signal of clocked inverter 18e.

Clocked inverter 18c is activated and inverts data from latch 18b when the internal master clock signal CLKM attains a high level and the complementary internal master clock signal /CLKM attains a low level. Clocked inverter 18e is activated and inverts latched data of latch 18d when the internal master clock signal CLKM attains a low level and the complementary internal master clock signal /CLKM attains a high level. Clocked inverters 18c and 18e are set to output high impedance state when they are inactivated.

Output buffer circuit 20 includes a clocked inverter 20a as a first transfer gate for inverting output data RD3 from latch 18f in response to the clock signals CLKO and /CLKO for internal output, and an output buffer 20b with a latch for latching, buffering and outputting an output signal of clocked inverter 20a to a data input/output node. Clocked inverter 20a is activated to invert the internal read data RD3 when the clock signal CLKO for internal output attains a high level. Output buffer 20b with a latch, the internal configuration of which will be described later in detail, latches, buffers and outputs supplied data to the outside of the device.

Read/transfer circuit 18 successively transfers data amplified by preamplifier 18a synchronously with the internal master clock signal CLKM, and has three pipeline stages. The operation of the data read portion shown in FIG. 6 will now be described with reference to a timing chart thereof shown in FIG. 7.

In the memory cell array shown in FIG. 5, a word line WL has been driven to a selected state by row select circuit 12, and sense amplifier circuit 14 has sensed, amplified and latched data of a memory cell connected to the selected word line WL. That is, sense amplifier 14a shown in FIG. 6 has latched data of a selected memory cell.

At time t1, a read command READ which instructs reading of data is applied in synchronization with a rising of the external master clock signal extCLKM. Column address buffer 24a incorporates a column address signal applied simultaneously with the read command in synchronization with the internal master clock signal CLKM to produce an internal column address signal for inputting to column decoder 16a. Column decoder 16a is activated in response to an activation signal from control signal generating circuit 22 to decode the internal column address signal and drive the column select signal CSL to a selected state. In response to the column select signal CSL, column select gate 16b is turned on and latched information of sense amplifier 14a is transmitted to internal I/O line pair IOP. Memory cell data on the internal I/O line pair IOP is amplified by preamplifier 18a and latched by latch 18b. Since approximately one clock cycle is required for transferring the memory cell data latched by sense amplifier 14a to latch 18b, latched information of latch 18b is defined (i.e., becomes data corresponding to the data of the selected memory cell shown by hatched portions in FIG. 7) at time t2 when the external master clock signal extCLKM rises.

At time t2 when the internal master clock signal CLKM rises, clocked inverter 18c is activated and data latched by latch 18b is transferred to latch 18b. In this state, clocked inverter 18e is inactivated and latch 18d is isolated from latch 18f. Then, when the internal master clock signal CLKM falls to a low level, clocked inverter 18e is activated to invert latched information RD2 of latch 18d for transferring to latch 18f. The phase of the clock signal CLKO for output is in advance of that of the internal master clock signal CLKM (the CLKM buffer and the CLKO buffer are the same in configuration). Thus, while the internal master clock signal CLKM is at a low level, the clock signal CLKO for output attains a high level, clocked inverter 20a is activated to output latched data RD3 of latch 18f to output buffer 20b with a latch. Output buffer 20b is a latched outputs valid data to the input/output node when a delay time tRD of clocked inverter 20a and output buffer 20b with a latch elapses.

External control signals and an address signals are taken in according to the master clock signal extCLKM. Thus, clock access time tAC is measured relative to the external master clock signal extCLKM. The clock access time tAC is given by the following equation:

$$tAC = tRD + tCD - tDIFF$$

wherein tDIFF represents a time difference between the clock signals CLKM and CLKO, and tCD represents a delay time of the clock signals CLKM and CLKO relative to the external clock signals extCLKM and extCLKO.

Thus, the clock access time tAC can be reduced by the time tDIFF by advancing the phase of the clock signal CLKO for output since data is read faster by the time tDIFF, and thus fast access can be achieved. When tCD=1.5 ns, tRD=4 ns and tDIFF=1.5 ns, the clock access time tAC is 4.0 ns and a required value of 4 ns, or the clock access time when the frequency of the external clock signals extCLKM and extCLKO is 100 MHz, can be obtained.

The use of the external clock signals extCLKM and extCLKO which are different in phase from each other (but are the same in frequency) further necessitates a pad and a CLKO buffer for the clock signal CLKO for output. The totaled area of CLKM buffer 6 and CLKO buffer 7 is almost equal to an area occupied by a CLK buffer which generates one internal clock signal CLK conventionally used: since the load of the internal clock signal CLK is almost equal to the totalled loads of the internal master clock signal CLKM and the clock signal CLKO for output, the size of a transsistor element serving as a component of CLKM buffer 6 and CLKO buffer 7 can be reduced and thus the circuit dimension of CLKM buffer 6 and CLKO buffer 7 can be reduced. Furthermore, only the power consumption of an input buffer receiving the external clock signal extCLKO for output is added in power consumption of the SDRAM (the power consumption of the internal clock output stage is the same as that when one internal clock signal is used), and thus there is almost no difference in power consumption between this SDRAM and an SDRAM in which one internal clock signal CLK is used.

Thus, the use of the clock signals CLKM and CLKO which are different in phase from each other allows fast access without increasing power consumption nor chip occupying area.

Furthermore, the use of the clock signals having these phases allows adjustment of valid period of output data DQ (Q), as described below.

Figure 8A:
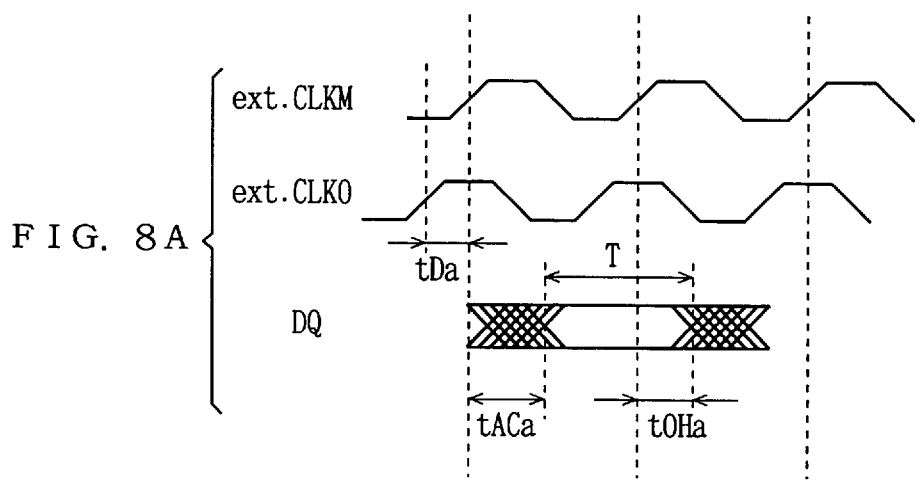
FIGS. 8A and 8B are timing chart for illustrating adjustment of the clock access time and hold time according to the first embodiment of the present invention.
Figure 8B:
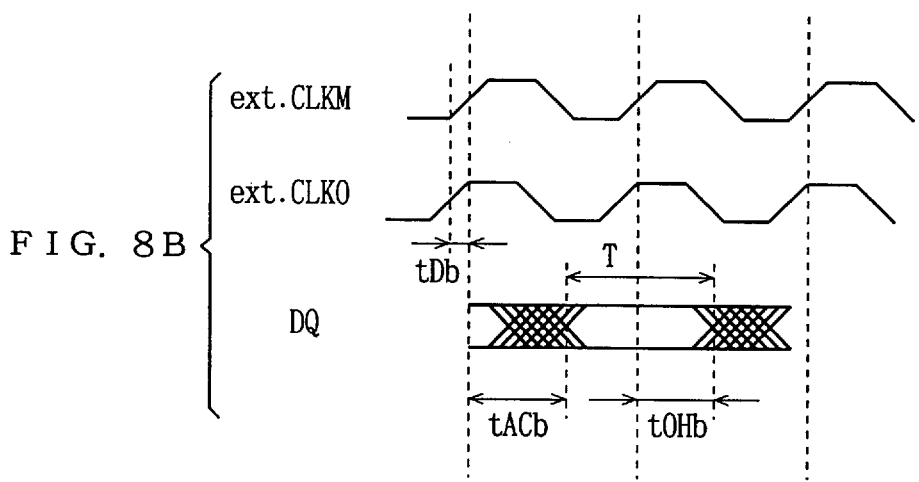

FIGS. 8A and 8B illustrate a manner in which valid data output period (valid data hold time) is adjusted. As shown in FIG. 8A, the period for which the external valid data DQ is output from the output buffer circuit is almost one clock cycle of the clock signal extCLKO for external output or less. The character TACa represents the clock access time when tDa represents a phase difference (the time difference) between the clock signal extCLKO for external output and the external master clock signal extCLKO. A valid data hold time tOHa is also obtained. On the other hand, in FIG. 8B, tACb represents the clock access time when tDb represents a phase difference between the clock signal extCLKO for output and the external master clock signal extCLKM, and tOHb represents a valid data hold time. The phase difference tDb is smaller than the phase difference tDa and thus the clock access time tACb is longer than the clock access time tACa (since output timing is delayed). On the other hand, the valid data hold time tOHb is longer than the valid data hold time tOHa (a period T for which valid data is output from the output buffer circuit is fixed). Thus, an optimal clock access time tAC and an optimal hold time tOH can be obtained by adjusting the phase difference between the clock signals extCLKO and extCLKM and thereby adjusting the clock access time tAC and the hold time tOH depending on the system to which the SDRAM is applied.

Thus, as an extreme example, a sufficiently long hold time tOH can be set in a system with low operating frequency by setting the phase difference tDIFF (tDa, tDb) at a negative value. In this example, however, a data set up time is required and thus the data should be defined prior to a rising of the external master clock signal extCLKM.

As described above, according to the first embodiment of the present invention, two external clock signals which are different in phase from each other are used to separately set the timing at which external signals (control signals and an address signal) are taken in and data output timing, so that an SDRAM having an optimal clock access time and an optical hold time depending on the processing system applied can be obtained. Specifically, the phase of the clock signal for data output is advanced relative to that of the clock signal which provides the timing at which external signals (control signals and an address signal) are taken in, to reduce the clock access time and fast access can be thus achieved.

[Second Embodiment]

Figure 9:
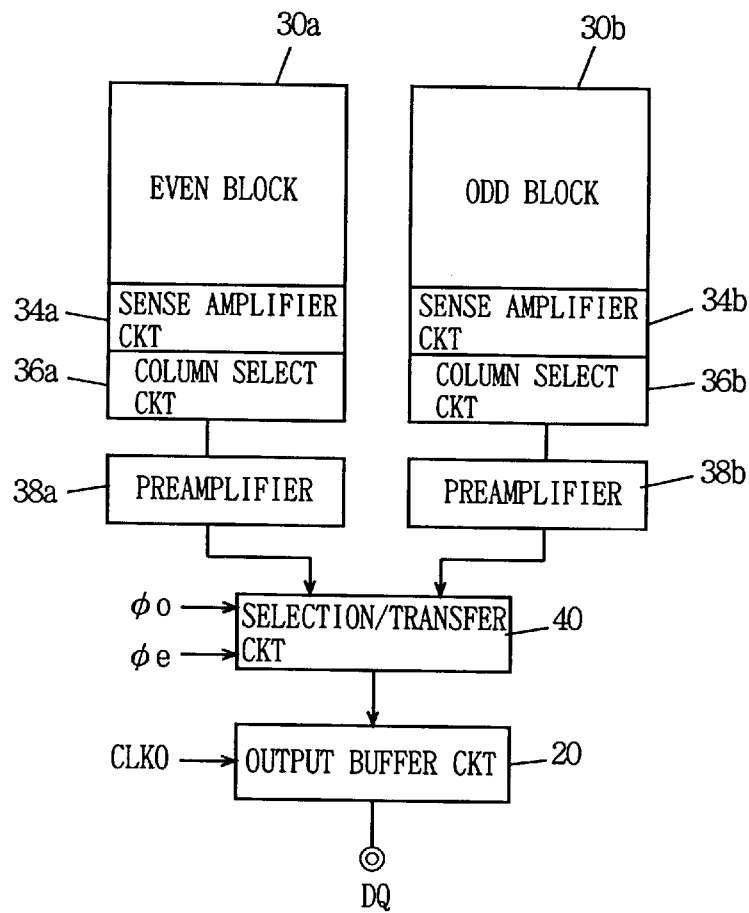
FIG. 9 schematically shows a configuration of the main portion of an SDRAM according to a second embodiment of the present invention.

FIG. 9 schematically shows the configuration of the data read portion of an SDRAM according to a second embodiment of the present invention. In FIG. 9, the SDRAM includes an even block 30a and an odd block 30b each having a plurality of memory cells arranged in a matrix. Even block 30a and odd block 30b are specified, for example, by the least significant bit CA0 of a column address signal applied simultaneously with an access command (a command which instructs reading or writing of data).

Provided for even block 30a are a sense amplifier circuit 34a provided corresponding to each column of even block 30a for sensing and amplifying data of a selected memory cell of a corresponding column, a column select circuit 36a for selecting a column of even block 30a according to a column address signal, and a preamplifier 38a for further amplifying data which has been amplified by a sense amplifier selected by column select circuit 36a. Column select circuit 36a includes a column decoder and a column select gate, as is in the first embodiment. Similarly, odd block 30b is provided with a sense amplifier circuit 34b, a column select circuit 36b and a preamplifier 38b.

The SDRAM further includes a selection/transfer circuit 40 for selecting in a predetermined order the data on a read data bus amplified by preamplifiers 38a and 38b in response to selection/transfer control signals φo and φe and transferring the selected data to an output buffer circuit 20. The selection/transfer control signals φo and φe are, as will be described later, produced according to a block specifying signal (the least significant bit CA0 of the column address signal, for example), the master clock signal CLKM and the clock signal CLKO for output.

Figure 10:
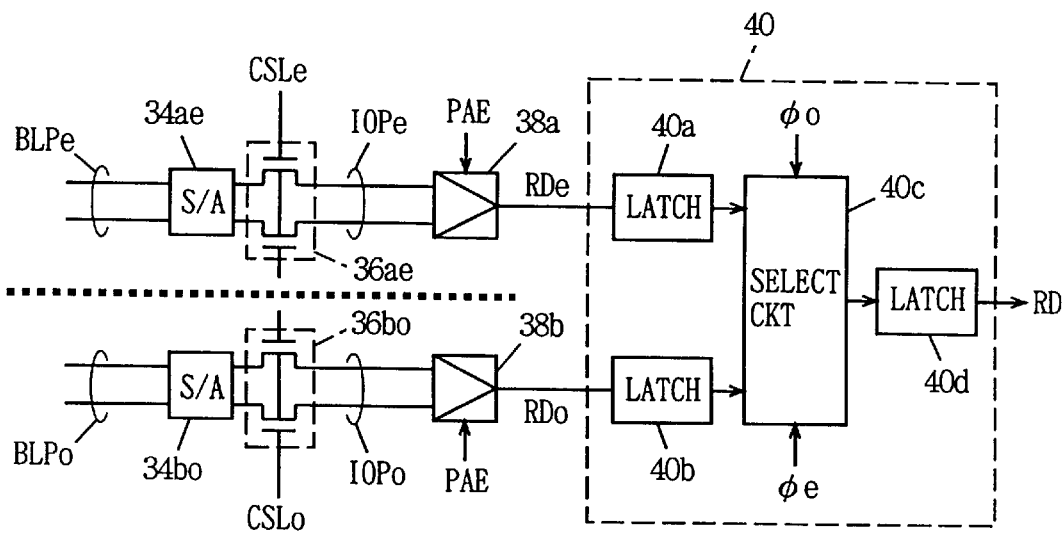
FIG. 10 schematically shows a configuration of the sense amplifier circuit, column select circuit, preamplifier and selection/transfer circuit shown in FIG. 9.

FIG. 10 shows the configuration of the selection/transfer circuit shown in FIG. 9 more specifically. In FIG. 10, sense amplifier circuit 34a includes a sense amplifier (S/A) 34ae provided for each of each bit line pair BLP of even block 30a. Sense amplifier circuit 34b includes a sense amplifier (S/A) 34bo provided for each bit line pair BLP of odd block 30b. Column select circuit 36a includes a column select gate 36ae turned on in response to a column select signal CSLe from the column decoder (not shown) to transmit amplified data of sense amplifier 34ae to an internal I/O line pair IOPe. Column select circuit 36b includes a column select gate 36bo turned on in response to a column select signal CSLo from the column decoder (not shown) to connect a bit line pair BLOo to an internal I/O line pair IOPo.

Data amplified by sense amplifier 34bo is transmitted to internal I/O line pair IOPo through column select gate 36bo. The column decoders included in column select circuits 36a and 36b receive a same column address signal, and bit line pairs BLPe and BLPo corresponding to the same column address in even block 30a and odd block 30b are selected simultaneously.

Preamplifiers 38a and 38b are each activated in response to a preamplifier enable signal PAE and amplify data on corresponding internal I/O line pairs IOPe and IOPo to produce data RDe and RDo on the read data bus.

Figure 11:
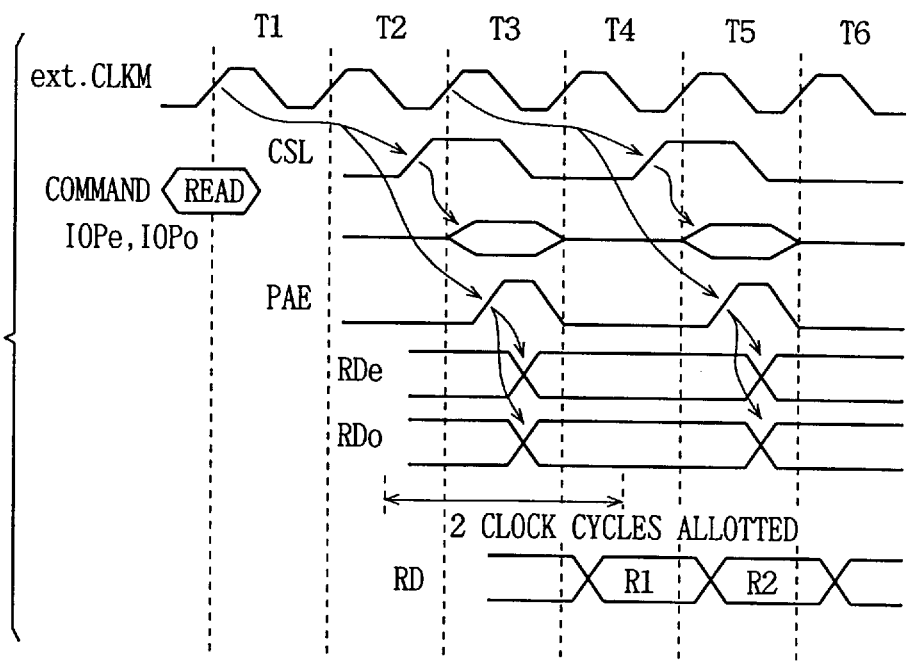
FIG. 11 is a timing chart illustrating operations of the circuits shown in FIG. 10.

Selection/transfer circuits 40 includes a latch 40a for latching the data RDe from preamplifier 38a, a latch 40b for latching the data RDo from preamplifier 38b, a select circuit 40c for selecting data latched by latch 40a and latch 40b according to the selection/transfer control signals φo and φe, and a latch 40d for latching data selected and transferred by select circuit 40c. The operation of the internal data read portion shown in FIG. 10 will now be described with reference to a timing chart thereof shown in FIG. 11.

In a clock cycle T1, a read command READ is applied synchronously with a rising of the external clock signal extCLKM. Column select operation is started according to a column address signal applied simultaneously with the read command, the column select signal CSL from the column decoder included in the column select circuit is selected in a clock cycle T2, and a bit line pair corresponding to the addressed column is selected. The column select operation is performed both in even block 30 and odd block 30b shown in FIG. 9. The column select operation causes corresponding column select gates 36ae and 36bo to be turned on, and information latched by sense amplifiers 34ae and 34bo are transmitted to internal I/O line pairs IOPe and IOPo, respectively. Then, the preamplifier enable signal PAE is activated, preamplifiers 38a and 38b perform amplifying operation, and the data RDe and RDo amplified by preamplifiers 38a and 38b are latched by latches 40a and 40b. Then, select circuit 40c sequentially selects the data latched by latches 40a and 40b according to the selection/transfer control signals φo and φe and transmits the data to latch 40d, and internal read data RDs from latch 40d is defined as R1 and R2 in clock cycles T4 and T5, respectively.

As shown in FIG. 7, when the data transfer path from the sense amplifier to the output buffer is configured by pipeline stages, the most time-consuming pipeline stage is the stage at which a sense amplifier is selected and the data of the selected sense amplifier is amplified by the preamplifier and is then latched. At this stage, the process is required in which a column selection signal is driven to a selected state according to an external column address signal, a sense amplifier is then selected according to the column select signal, the data of the selected sense amplifier is transferred to the preamplifier, and the data transferred from the sense amplifier is amplified by the preamplifier and is then latched. As shown, for example, in FIG. 6, the other pipeline stages only sequentially transfer data according to a clock signal and these stages require only a short time. When a time period of 12 ns is required until data is amplified and latched at preamplifier, for example, the shortest period of the clock signal is limited by 12 ns, or a processing time required by the pipeline stage for selecting a sense amplifier and amplifying data by the preamplifier which requires the longest processing time, even if a processing time required by each of the other pipeline stages is 10 ns or less.

As shown in FIGS. 9 and 10, however, two-bit data can be simultaneously selected and sequentially transferred according to a clock signal to halve the processing time required at the pipeline stage as compared with the configuration in which one-bit data is successively selected. Thus, as shown in the timing chart of FIG. 11, two clock cycles can be allotted for a column select interval, providing plenty time for the operation from selection of a sense amplifier to amplification by the preamplifier. Thus, the pipeline stages can operate at high speed and fast data reading can be achieved. That is, when the processing time of each of the pipeline stages is set, for example, at 10 ns, the operating frequency of the SDRAM can be increased upto 100 MHz or more.

Figure 12:
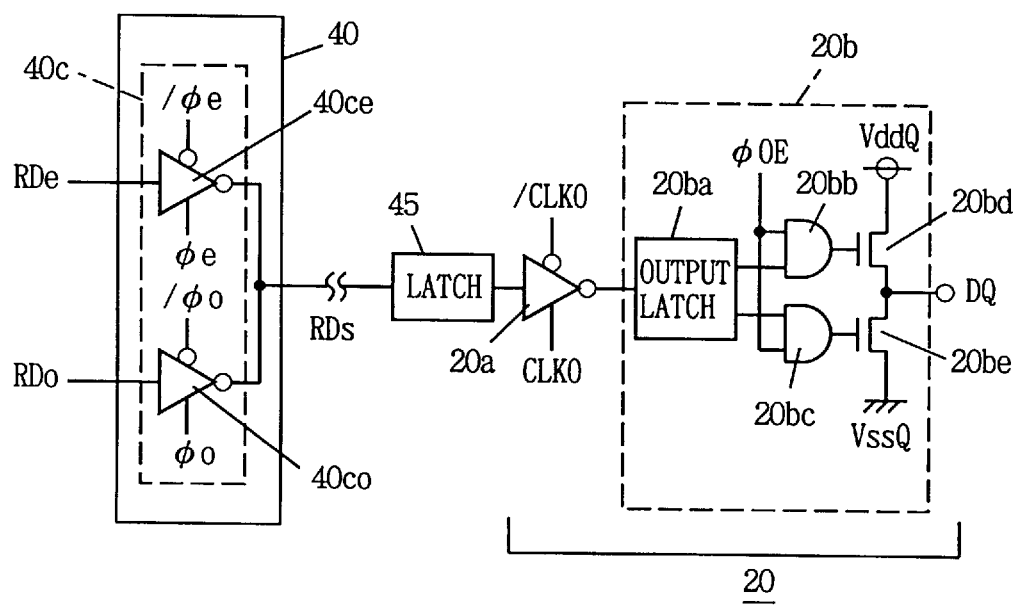
FIG. 12 shows a configuration of the selection/transfer circuit and output buffer circuit according to the second embodiment of the present invention.

FIG. 12 specifically shows configurations of the select circuit of the select/transfer circuit shown in FIG. 10 and the output buffer circuit shown in FIG. 9.

In FIG. 12, select circuit 40c includes a clocked inverter 40ce rendered conducting (activated) when the selection/transfer control signals φe attains a high level, and a clocked inverter 40co conducting when the transfer/control signal φo attains a high level. Clocked inverter 40ce, when activated, transfers the data RDe read from the even block. Clocked inverter 40co, when activated, transfers the data RDo read from the odd block.

Data RDs selected by select circuit 40c is supplied to a latch 45 provided at a preceding stage of output buffer circuit 20. Latch 45 may be latch 40d of selection/transfer circuit 40 shown in FIG. 10 or latch 18f described in the first embodiment with reference to FIG. 6.

Output buffer circuit 20 includes a clocked inverter 20a activated when the internal clock signal CLKO for output attains a high level, and an output buffer 20b for buffering an output signal of clocked inverter 20a for outputting to the data input/output node (DQ). Output buffer 20b includes an output latch 20ba as a first latch for latching data transferred from clocked inverter 20a and outputting data complementary to each other, an AND circuit 20bb receiving an output permission signal φOE and one output signal of output latch 20ba, an AND circuit 20bc receiving an output permission signal φOE and an output signal of output latch 20ba, an n channel MOS transistor 20bd turned on when an output signal AND circuit 20bb attains a high level to drive the data input/output node to a voltage level of a power supply voltage VddQ, and an n channel MOS transistor 20be operating when an output signal of AND circuit 20bc attains a high level to drive the data input/output node (DQ) to a ground voltage VssQ level.

The output permission signals φOE, the way of its generation being described in detail later, attains an active high level in an elapse of (CAS latency −1) clock cycle after application of a read command, and then is maintained at active state for a burst length period and sets the output stage of the data output buffer circuit to an output low impedance state. When the output permission signal φOE attains an inactive low level, MOS transistors 20bd and 20be are both turned off and output buffer 20b is set to an output high impedance state. The operation of the data read portion shown in FIG. 12 will now be described with reference to the timing chart shown in FIG. 13.

Phase relation between the external master clock signal extCLKM and the clock signal extCLKO for external output is the same as that of the first embodiment. The internal clock signals CLKM and CLKO are produced according to the external clock signals extCLKM and extCLKO. The internal clock signals CLKM and CLKO are produced respectively at the clock input buffers described in the first embodiment, and have a fixed width of pulse.

In a clock cycle T1, a read command READ is applied, and an internal read instructing signal φread which internally attains a high level for a predetermined time according to the read command READ is produced. Internal read operation (including column select operation) is started using the internal read instructing signal φread as a triggering signal. Column select operation is performed according to the internal master signal CLKM and data RDe and RDo from the even and odd blocks are amplified by preamplifiers and then latched. Data latched by latches 40a and 40b shown in FIG. 10 are defined as data QeO and QoO according to outputs of the preamplifiers in a clock cycle T3, respectively.

Figure 13:
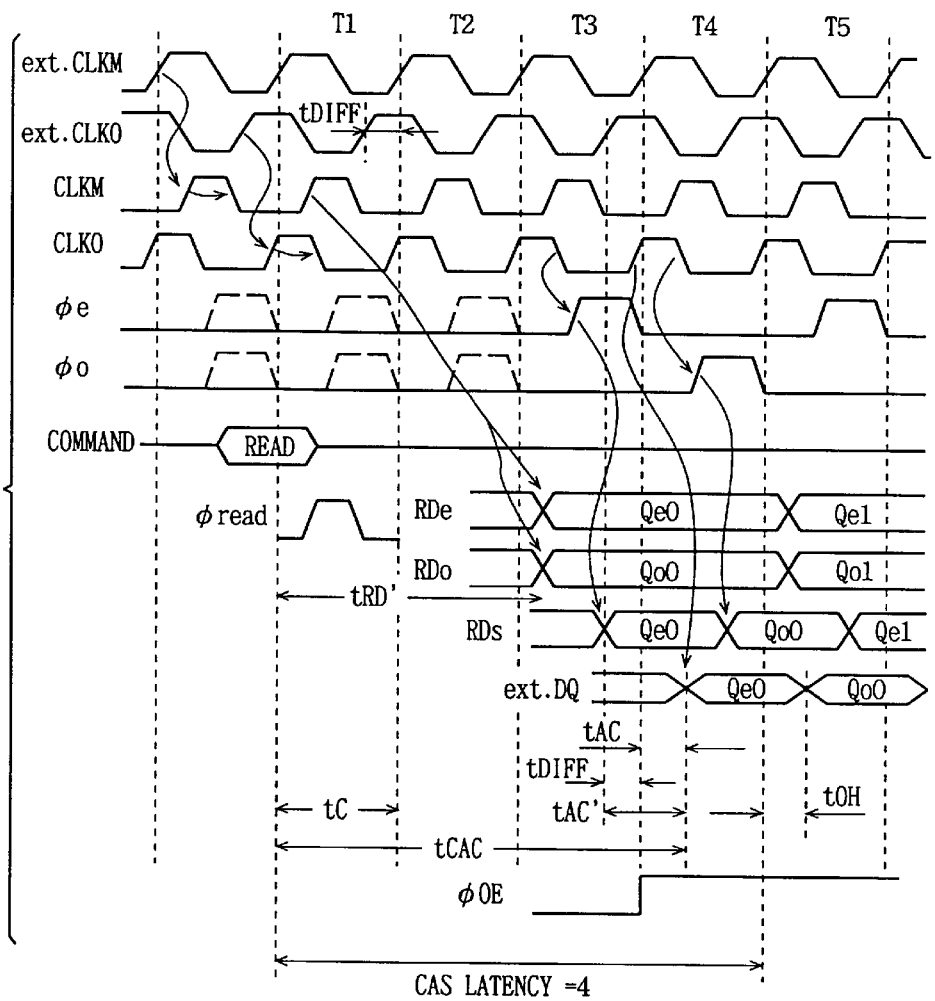
FIG. 13 is a timing chart illustrating operation of the circuit shown in FIG. 12.

In the clock cycle T3, the selection/transfer control signals φe and φo which have been output in a predetermined order (a clock cycle order determined by the read command) are how produced in a predetermined order according to the block specifying signal (the least significant column address signal bit: CA0). FIG. 13 shows the state when the even block is first specified. When the master clock signal CLKM attains a high level, the selection/transfer control signals φe and φo each rise synchronously with a falling of the internal clock signal CLKO for output. That is, when clocked inverters 40ce and 40co are rendered conducting in select circuit 40c shown in FIG. 12, clocked inverter 20a at a stage subsequent to latch 45 is surely turned off. This prevents the data selected by select circuit 40c from passing through clocked inverter 20a via latch 45 and being supplied to output buffer 20b to ensure accurate reading of data. When the selection/transfer control signal φe attains a high level, data QeO from the even block is selected and transferred to latch 45 and latched therein.

Then in a clock cycle T4, clocked inverter 20a is activated (rendered conducting) in response to a rising of the internal clock signal CLKO for output to transmit the data latched by latch 45 to output buffer 20b. The output permission signal φOE has been activated one cycle therefore (this configuration will be described later in detail). This allows internal read data from clocked inverter 20a to be latched by output latch 20ba and to be transmitted to the gates of MOS transistors 20bd and 20be via AND circuits 20bb and 20bc. MOS transistors 20bd and 20be at the output stage are turned on/off according to the data applied and external read data extDQ is output to the data input/output node. At the clock cycle T4 when the internal clock signal CLKO for output falls to a low level (when the master clock signal CLKM attains a high level), the selection/transfer control signal φo attains a high level and clocked inverter 40co is activated to select data QoO from the odd array block for supplying to latch 45.

In a clock cycle T5 when the internal clock signal CLKO for output rises to a high level, clocked inverter 20a is activated to supply the data latched by latch 45 to output buffer 20b and the data is output as the external data extDQ via output buffer 20b. Even when the clock signal CLKO for output attains a low level, output latch 20ba latches the data, so that output buffer 20b continuously outputs the data until clocked inverter 20a is again activated.

In the two-bit prefetch method also, two clock signals which are different in phase from each other can be used to obtain fast clock access time tAC. The tolerance of the phase difference (time difference) tDIFF between the clock signal extCLKO for external output and the external master clock signal extCLKM will now be considered.

The following relation should be satisfied:

$$(CL-1) \cdot tC - tDIFF + tAC' > tCAC$$

wherein tCAC represents a non-synchronous access time taken from inputting of a read command READ to outputting of data to a data output node extDQ, tAC' represents a time taken from a rising of the clock signal extCLKO for external output to data output (a clock access time relative to the clock signal extCLKO), tC represents a clock cycle time and CL represents a CAS latency.

That is, $$tDIFF < (CL-1) \cdot tC + tAC' - tCAC.$$

As an example, when tC=5 ns, CL=4, tCAC=17 ns and tAC'=4 ns, tDIFF<2 ns.

Even when the clock cycle time tC is 5 ns and the clock frequency is 200 MHz, two-bit prefetch method can be applied to provide sufficient time period to latch data from a sense amplifier in a latch at a stage subsequent to a preamplifier. Furthermore, the use of two clock signals allows the clock access time to be reduced by the phase difference (time difference) tDIFF between the two clock signals and thus fast access can be achieved.

When the phase difference tDIFF is 0, that is, when the external clock signals extCLKM and extCLKO are input at the same timing, a normal operation, which is the same as that of an SDRAM employing one clock signal, is obtained. In this example, the hold time tOH can be increased by the phase difference tDIFF as compared with the example in which two clock signals are used as shown in FIG. 13. Now, the configuration of a portion for generating each of control signals will be described.

Figure 14:
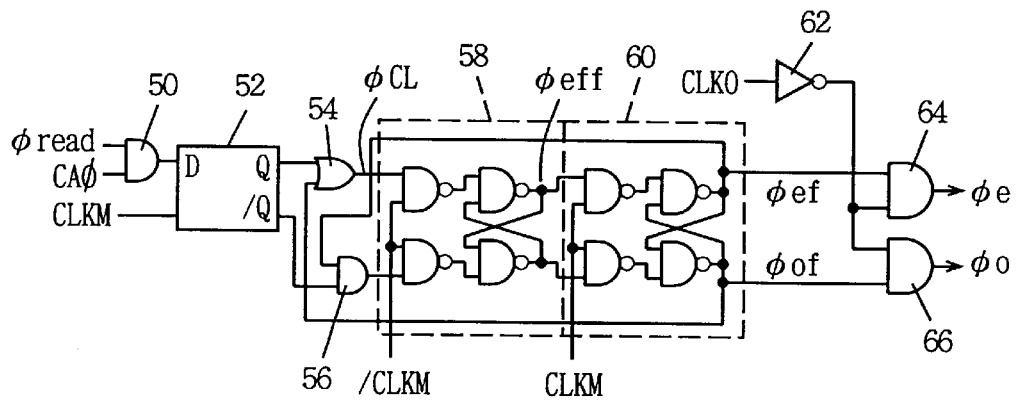
FIG. 14 shows a configuration of the selection/transfer control signals φe and φo shown in FIG. 12.

FIG. 14 schematically shows the configuration of the selection/transfer control signal generating portion. FIG. 14 schematically shows the configuration of the selection/transfer control signal generation portion when the even array block is first specified. In FIG. 14, the selection/transfer control signal generation portion includes an AND circuit 50 receiving an internal read operation instructing signal φread and a column address signal CAφ, a (CL−2) counter 52 inputting an output signal of AND circuit 50 according to the internal master clock signal CLKM, counting up the internal master clock signal CLKM to a predetermined number and outputting a count up signal at its output Q when the predetermined number has been counted up, an OR circuit 54 receiving an output signal of count circuit 52 at one input, an AND circuit 56 receiving at one input a signal from a complementary output /Q of counter circuit 52, a register circuit 58 taking in output signals of OR circuit 54 and AND circuit 56 in synchronization with the complementary internal master clock signal /CLKM and latching the output signals, and a register circuit 60 latching and outputting an output signal of register circuit 58 according to the internal master clock signal CLKM. An output signal φef of register circuit 60 is input to the other input of AND circuit 56, and an output signal φof of register circuit 60 is input to the other input of OR circuit 54. The signals φef and φof have twice the period of the internal master clock signal CLKM and are signals complementary to each other.

Figure 15:
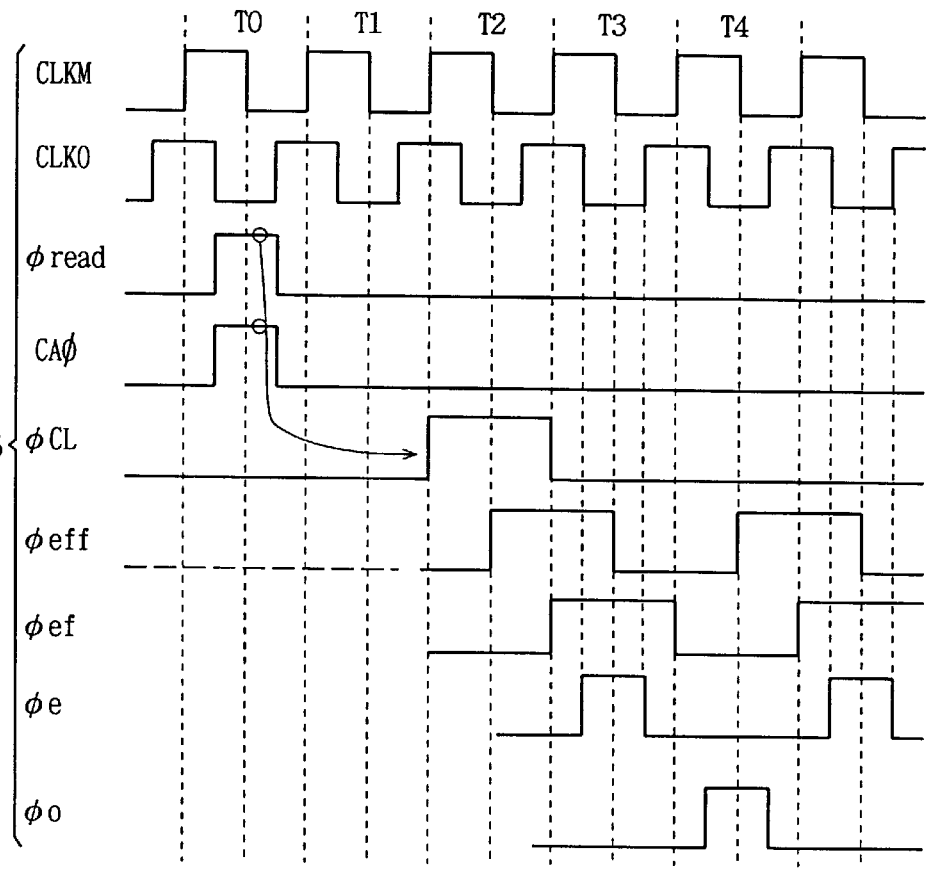
FIG. 15 is a timing chart illustrating operations of the circuits shown in FIG. 14.

The selection/transfer control signal generating portion further includes an inverter circuit 62 receiving the clock signal CLKO for internal output, an AND circuit 64 receiving an output signal of inverter circuit 62 and the output signal φef of register circuit 60, and an AND circuit 66 receiving the output signal of inverter circuit 62 and the output signal φof of register circuit 60. AND circuit 64 outputs the selection/transfer control signal φe and AND circuit 66 outputs the selection/transfer control signal φo. An operation of the selection/transfer control signal generation portion shown in FIG. 14 will now be described with reference to the timing chart shown in FIG. 15.

Register circuits 58 and 60 have the same configuration as register circuits 5a and 5b shown in FIG. 4A. Thus, register circuit 58 is set to a through state when the complementary internal master clock signal /CLKM attains a high level and to a latching state when the complementary internal master clock signal /CLKM attains a low level. Register circuit 60 is set to a through state when the internal master clock signal CLKM attains a high level and to a latching state when the internal master clock signal CLKM attains a low level.

In a clock cycle T0, a read command is applied and the internal read instructing signal φread attains a high level. The block specifying signal (the least significant address signal bit, for example) CAφ applied simultaneously with the read command attains a high level and the even array block is specified. (CA−2) counter 52 takes an output signal of AND circuit 50 in synchronization with a rising of the master clock signal CLKM and counts up to a predetermined number of clocks. When CAS latency is four, (CL−2) counter 52 counts up to the number of clocks, 2, which is smaller than the value of the CAS latency CL by two, and sets an output signal from its output Q to a high level in a clock cycle T2. This allows an output signal φCL of OR circuit 54 to attain a high level independently of the state of the output signal of register circuit 60. Since (CL−2) counter 52, with the configuration described in detail later, performs counting operation synchronously with the master clock signal CLKM and is configured by a register circuit, the output signal φCL of OR circuit 54 is held at the high level for one cycle period of the master clock signal CLKM. When the master clock signal CLKM falls to a low level, register circuit 58 is set to a through state and takes the output signal φCL of OR circuit 54 and the output signal φeff attains a high level (the output signal of AND circuit 56 attains a low level). That is, the output signal φeff of a register circuit 58 attains a high level in the clock cycle T2.

In a clock cycle T3, in synchronization with a rising of the internal master clock signal CLKM, register circuit 60 is set to a through state, takes in the signal φeff and sets the output signal φef to a high level. The signals φef and φof are signals complementary to each other. The signal φef is input to an input of AND circuit 56 and the signal φof is input to OR circuit 54. Thus, when the signal φef rises to a high level in the clock cycle T3, the signal φof attains a low level and the output signal φCL of OR circuit 54 attains a low level. In the clock cycle T3 when the internal master clock signal CLKM falls to a low level, register circuit 58 is set to a through state and its output signal φeff falls to a low level. Thereafter, the output signal φef changes with a delay of half a clock cycle from the change of signal φeff.

The logic product of the signal φef and the inverted version of the clock signal CLKO for output produces the signal φe, and the logic product of the signal φof and the inverted version of the internal clock signal CLKO for output produces the signal φo. Thus, in and after the clock cycle T3, the signals φe and φo alternately attain a high level in synchronization with a falling of the clock signal CLKO for output. By the use of the signals φef and φof synchronized with the internal master clock signal CLKM, the signals φef and φof can be changed in synchronization with the internal master clock signal CLKM which controls internal operation so that the control signals φef and φof according to an internal circuit state (the state in which internal read data is read out) can be produced. Logic products of the signals φef and φof and the inverted version of the clock signal CLKO for output are used to prevent data transferred to the latch (45) arranged at a stage preceding the output buffer circuit from being output transparently via the output buffer circuit when the data is transferred to the latch (45), and thus accurate, fast data read operation can be achieved.

Figure 16:
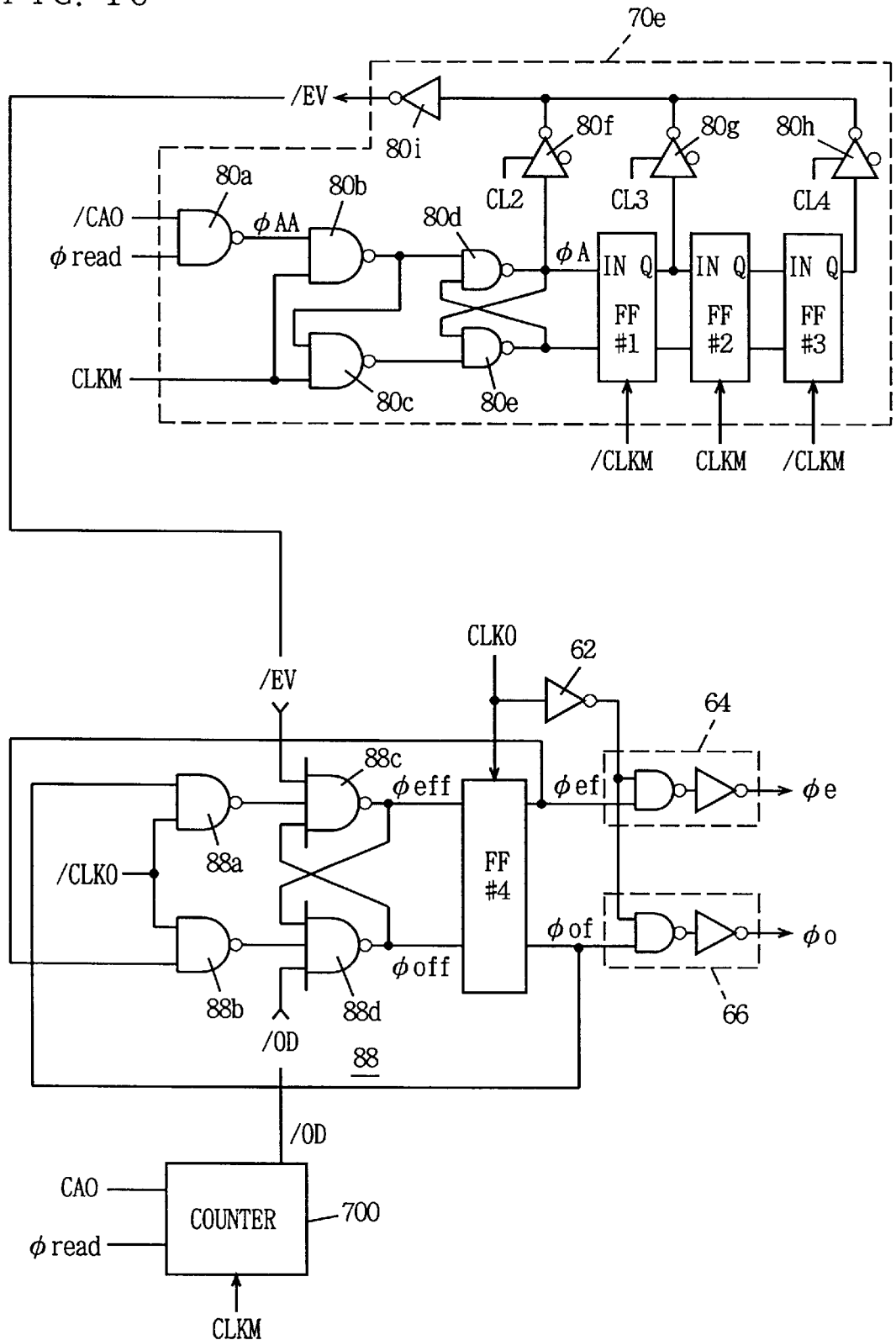
FIG. 16 shows in detail the configuration of the selection/transfer control signal generating portion shown in FIG. 14.

FIG. 16 shows a more detailed configuration of the selection/transfer control signal generation portion. In FIG.

16, the selection/transfer control signal generation portion includes a counter 70e for counting a CAS latency for the even array block, a counter 70o for counting for a CAS latency for the odd array block, and a register circuit 88 for producing the timing signals φef and φof according to output signals /EV and /OD of counters 70e and 70o.

Counter 70e includes an NAND circuit 80a receiving a least significant column address signal bit /CAS0 as the block specifying signal and the internal read instruction signal φread, an NAND circuit 80b receiving an output signal of NAND circuit 80a and the internal master clock signal CLKM, an NAND circuit 80c receiving an output signal of NAND circuit 80b and the internal master clock signal CLKM, an NAND circuit 80d receiving the output signal of NAND circuit 80b at one input, and an NAND circuit 80e receiving an output signal of NAND circuit 80c at one input. An output signal φA of NAND circuit 80d is input to the other input of NAND circuit 80e, and an output signal of NAND circuit 80e is input to the other input of NAND circuit 80d.

Counter 70e further includes a register circuit FF#1 receiving output signals of NAND circuit s 80d and 80e complementary to each other, and latching and outputting the complementary output signals in response to the complementary internal master clock signal /CLKM, a register circuit FF#2 latching and outputting an output signal of register circuit FF#1 in response to the internal master clock signal CLKM, and a register circuit FF#3 latching and outputting an output signal of register circuit FF#2 in response to the complementary internal master clock signal /CLKM. Register circuits FF#1–FF#3 includes the same NAND type flipflop configuration as register circuit 5a shown in FIG. 4.

Counter 70e further includes a clocked inverter 80f selecting the output signal φA of NAND circuit 80d in accordance with a CAS latency indicating signal CL2, a clocked inverter 80c selecting the output signal of register circuit FF#1 in accordance with a CAS latency indicating signal CL3, a clocked inverter 80h selecting an output signal of register circuit FF#3 in accordance with a CAS latency indicating signal CL4, and an inverter circuit 80i for inverting output signals of clocked inverts 80f–80h. The CAS latency indicating signals CL2, CL3 and CL4 indicate that CAS latency is two, three and four, respectively.

The CAS latency indicating signals CL2–CL4 are stored in a register for storing specific CAS latency information according to an output signal of a command decoder (not shown) and one of the CAS latency indicating signals CL2–CL4 is activated. Thus, one of clocked inverters 80f–80h is activated, and inverts and outputs a signal input. Inverter circuit 80i outputs the count up signal /EV when the even block is specified. Counter 70o has the same circuit configuration as counter 70e except that it receives a least significant address signal bit CA0, not the least significant address signal bit /CA0, as the block specifying signal. The odd block is specified when the least significant address signal bit CA0 is 1, and the even block is specified when the lest significant address signal bit CA0 is 0.

Register circuit 88 includes NAND circuits 88a and 88b enabled according to the complementary internal master clock signal /CLKO, an NAND circuit 88c receiving an output signal of NAND circuit 88a, the count up signal /EV from counter 70e and an output signal of NAND circuit 88b, an NAND circuit 88d receiving the output signal of NAND circuit 88b, a count up signal /OD output from counter 70o and an output signal of NAND circuit 88c, and a register circuit FF#4 taking in and outputting output signals of NAND circuits 88c and 88d in accordance with the complementary internal clock signal CLKO for output. Register circuit FF#4 has the same circuit configuration as register circuit 5a shown in FIG. 4.

Output signals φef and φof of register circuit FF#4 are input to AND circuits 64 and 66, respectively. AND circuits 64 and 66 are enabled when an output signal of an inverter circuit 62 which receives the internal clock signal CLKO for output attains a high level. AND circuits 64 and 66 output the selection/transfer control signals φe and φo. An operation of the selection/transfer control signal generation portion shown in FIG. 16 will now be described with reference to the timing chart shown in FIG. 17.

Figure 17:
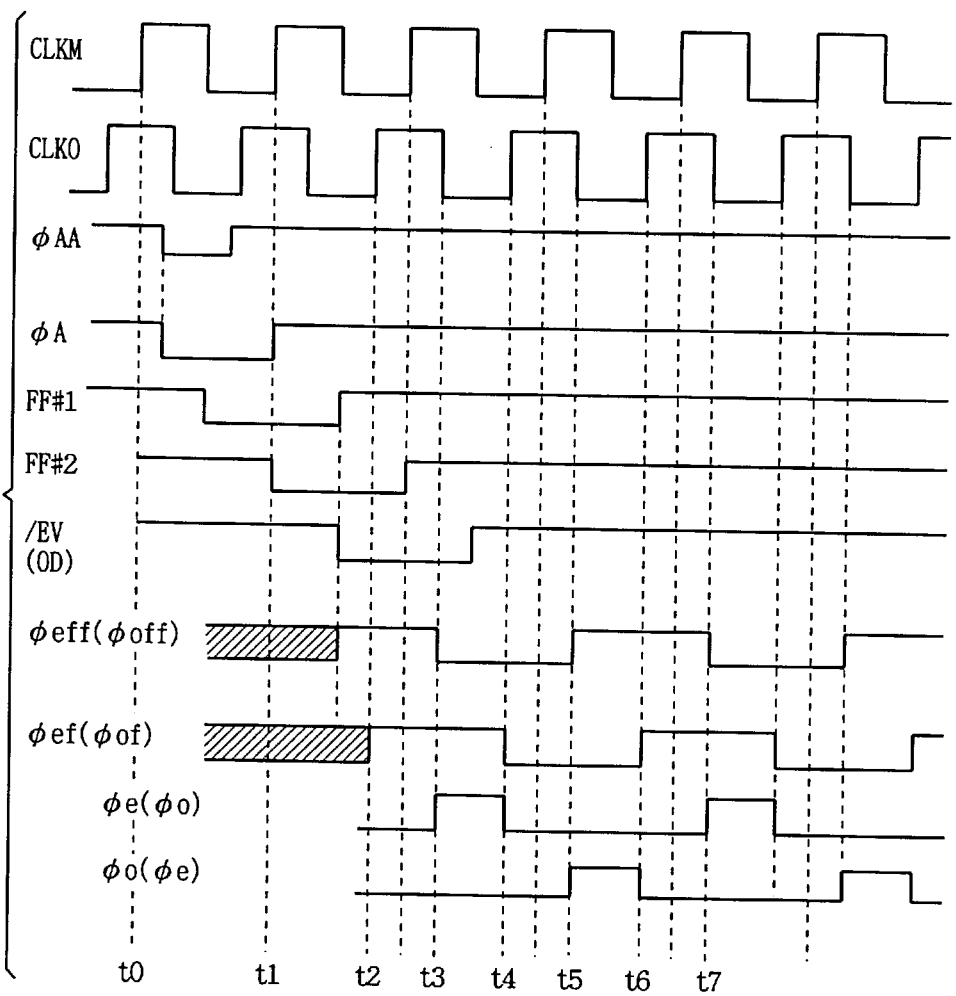
FIG. 17 is a timing chart illustrating operations of the circuit shown in FIG. 16.

FIG. 17 shows both the case where the even block is specified and the case where the odd block is specified. At time t0 when a read command is applied at a rising of the internal master clock signal CLKM to a high level, the internal read instruction signal φread attains an active high level. According to the value of the least significant column address signal bit CA0 applied simultaneously with the read command, an output signal φAA of NAND circuit 80a attains a low level for a predetermined period (when the least significant column address signal bit /CA0 is 1). When the output signal φAA of NAND circuit 80a attains a low level, the output signal of NAND circuit 80b attains a high level. The internal master clock signal CLKM has been at a high level, the output signal of NAND circuit 80c attains a low level, a flipflop configured by NAND circuits 80d and 80e is reset, and a signal φA attains a low level. The internal read instructing signal φread attains a high level for a period shorter than one clock cycle period. Thus, at time t1 when the internal master clock signal CLKM attains a high level, the signal φA from NAND circuit 80d is reset to a low level.

Register circuits FF#1–FF#3 take in and output applied input signals in accordance with clock signals respectively applied. Thus, register circuits FF#1–FF#3 each output the signal φA with a delay of half a clock cycle. When CAS latency is four, clocked inverter 80h is activated to invert and output the output signal of register circuit FF#3. The remaining clocked inverters 80f and 80g are in output high impedance state. When the signal /EV falls to a low level, the signal φeff of NAND circuit 88ef in register circuit 88 is set to a high level. At time t2 when the internal clock signal CLKO for output rises to a high level, register circuit FF#4 is set to a through state and according to this high-level signal φeff, the signal φef is set to a high level. The signal φof is a signal complementary to the signal φef. At time t3 when the clock signal CLKO for output falls to a low level, the output signal of inverter circuit 62 attains a high level and the signal φe attains a high level.

On the other hand, at time t3 when the clock signal CLKO falls, register circuit 88 is set to a through state, the output signal of NAND circuit 88b attains a low level, the output signal NAND circuit 88a attains a high level (the signal φof is at a low level), and the signal φeff falls to a low level. Thereafter, the signal φeff changes with twice the period of the clock signal CLKO. The signal φef changes with a delay of half a clock cycle for the signal φeff.

At time t5 when the clock signal CLKO falls to a low level, the signal φof is at a high level and the signal φo attains a high level until time t6. Then, at time t7 when the clock signal CLKO again attains a low level, the signal φe attains a high level.

When the column address signal bit CA0 attains a high level, the signal φof first attains a low level and the signal φo attains a high level earlier than the signal φe, as shown in FIG. 17 with the blacketed indications.

In the configuration shown in FIG. 16, register circuit 88 and FF#4 latches and outputs data according to the internal clock signal CLKO for output. Register circuit 88 and FF#4 may perform data transfer operation according to the internal master clock signal CLKM in place of the clock signal CLKO, as shown in FIG. 14.

Figure 18A:
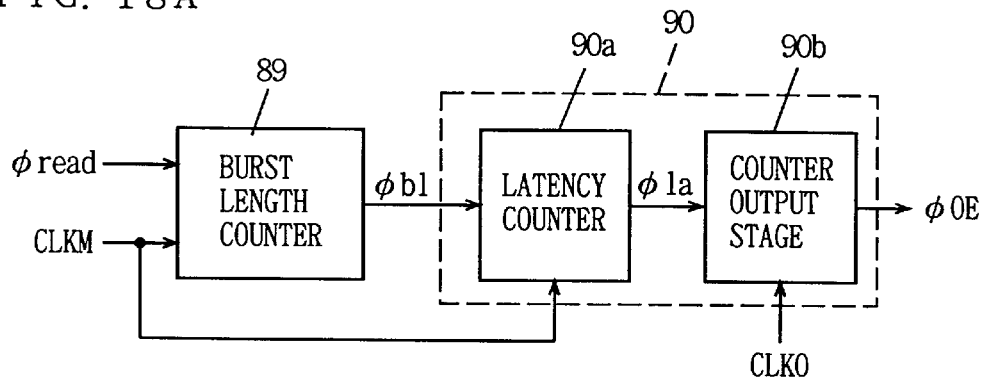
FIG. 18A schematically shows a configuration of an output permission signal generation portion which sets the output buffer to a low output impedance state and FIG. 18B is a timing chart illustrating operations of the circuits shown in FIG. 18A.

FIG. 18A schematically shows a configuration of the portion generating an output permission signal φOE. In FIG. 18A, the output permission signal generating portion includes a burst length counter 89 responsive to activation of the internal read instructing signal φread for counting up the internal master clock signal CLKM to the number equal to a predetermined burst length, and a latency delay circuit 90 for delaying an output signal φb1 of burst length counter 89 by a clock cycle(s) of a predetermined CAS latency CL.

When the internal data read operation instructing signal φread is activated, burst length counter 89, the configuration of which will be described in detail later, holls the output signal φb1 at an active high level for a clock cycle period determined by the burst length from that clock cycle. Latency delay circuit 90 includes a latency counter 90a delaying the output signal φb1 of burst length counter 89 by (CL−1), and a counter output stage 90b delaying an output signal φ1a of latency counter 90a by one clock cycle period of the clock signal CLKO for output. Counter stage 90b outputs the output permission signal φOE. Latency counter 90a operates synchronously with the internal master clock signal CLKM. The operation of the output permission signal generating portion shown in FIG. 18A will now be described with reference to the timing chart shown in FIG. 18B.

Figure 18B:
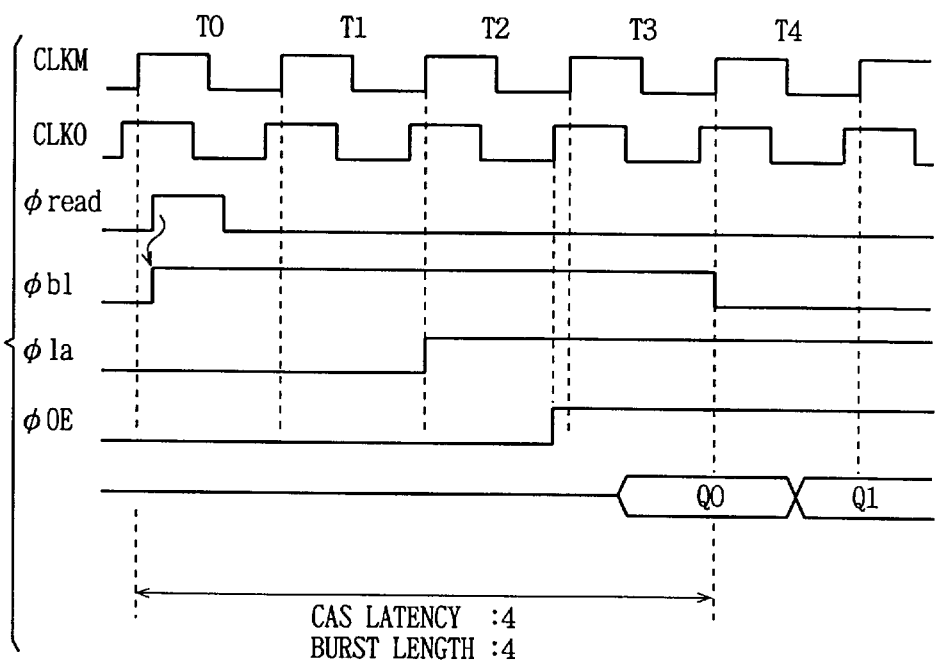

In a clock cycle T0 when a read command is applied, the internal read instructing signal φread attains an active high level for a predetermined period. In response to the activation of the internal read instruction signal φread, burst length counter 89 sets the output signal φb1 to an active high level. Then burst length counter 89 maintains the output signal φb1 at the high level for a predetermined burst length period and when a clock cycle(s) determined by the burst length has elapsed, burst length count 89 sets the output signal φb1 to a low level in synchronization with a rising of the internal master clock signal CLKM. FIG. 18B shows the operation where the burst length is four and the output signal φb1 from burst length counter 89 falls to a low level in synchronization with a rising of the internal master clock signal CLKM in a clock cycle T4.

Latency counter 90a delays the output signal φb1 of burst length counter 89 for a clock cycle period shorter than the CAS latency CL by one clock. Thus, when CAS latency is four, the output signal φ1a of latency counter 90a attains a high level in a cycle T2 when three clock cycles have elapsed since a read command was applied. Counter output stage 90b transfers the output signal φ1a of latency counter 90a in synchronization with the internal clock signal CLKO for output. Thus, the output permission signal φoe attains a high level in synchronization with a rising of the internal clock signal CLKO for output in the clock cycle T2. Counter output stage 90b operates with the clock signal CLKO for output, since the internal clock signal CLKO for output is used in data transfer from the latch 45 to the output buffer circuit and this data transfer operation is synchronized with enabling of the output buffer circuit.

Figure 19:
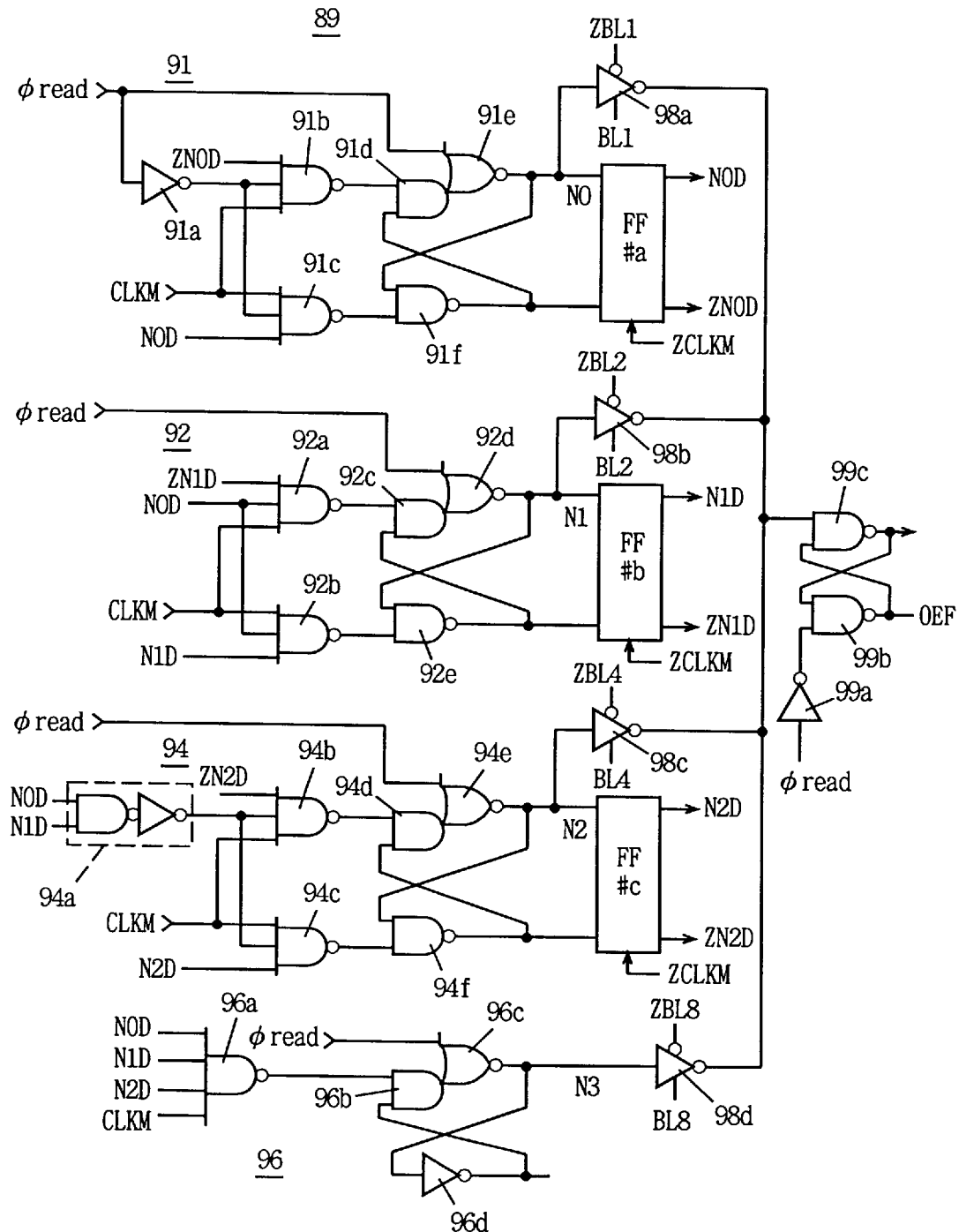
FIG. 19 schematically shows a configuration of the burst length counter shown in FIG. 18A.

FIG. 19 shows one example of the configuration of the burst length counter 89 shown in FIG. 18A. In FIG. 19, burst length counter 89 includes circuit portions for burst lengths of one, two, four and eight.

A circuit portion for a burst length of one includes an inverter circuit 91a receiving the internal read instructing signal φread, a three-input NAND circuit 91b receiving an output signal of inverter circuit 91a, the internal master clock signal CLKM and an signal ZN0D, a three-input NAND circuit 91c receiving the output signal of inverter circuit 91a, the internal master clock signal CLKM and a signal N0D, an AND circuit 91d receiving an output signal of NAND circuit 91b at one input, an NAND circuit 91f receiving an output signal of NAND circuit 91c at one input, and an NOR circuit 91e receiving the internal read instruction signal φread and an output signal of AND circuit 91d.

An output signal of NAND circuit 91f is input to the other input of NAND circuit 91d. An output signal N0 of NOR circuit 91e is input to the other input of NAND circuit 91f.

The circuit portion for the burst length of one further includes a register circuit FF#a transferring the output signal of NOR circuit 91e and the output signal of NAND circuit 91f in synchronization with the complementary internal master clock signal ZCLKM. Register circuit FF#a has the same configuration as register circuit 5a shown in FIG. 4, and is set to a through state when the complementary internal master clock signal ZCLKM attains a high level and to a latching state when the complementary internal master clock signal ZCLKM attains a low level and outputs complementary signals N0D and ZN0D.

A circuit portion 92 for a burst length of two includes a three-input NAND circuit 92a receiving signals N0D and ZN1D and the internal master clock signal CLKM, a three-input NAND circuit 92b receiving the internal master clock signal CLKM and signals N0D and N1D, an AND circuit 92c receiving an output signal of NAND circuit 92a at one input, an NAND circuit 92e receiving an output signal of NAND circuit 92b at one input, an NOR circuit 92d receiving an output of NAND circuit 92c and the internal read instructing signal φread, and a register circuit FF#b transferring output signals of NOR circuit 92d and NAND circuit 92e in synchronization with the complementary internal master clock signal ZCLKM.

An output signal of NAND circuit 92e is input to the other input of NAND circuit 92c. An output signal N1 of NOR circuit 92d is input to the other input of NAND circuit 92e. Register circuit FF#b has the same configuration as register circuit FF#a. Register circuit FF#b outputs signals N1D and ZN1D.

A circuit portion 94 for a burst length of four includes an AND circuit 94a receiving the signals N0D and N1D, a three-input NAND circuit 94b receiving an output signal of AND circuit 94a, a signal ZN2D and the internal master clock signal CLKM, an NAND circuit 94c receiving the internal master clock signal CLKM, the output signal of AND circuit 94a and a signal N2D, an AND circuit 94d receiving an output signal of NAND circuit 94b at one inout, an NAND circuit 94f receiving an output signal of NAND circuit 94c at one input, and a register circuit FF#c transferring an output signal of an NOR circuit 94e and an output signal of NAND circuit 94f in synchronization with the complementary internal master clock signal ZCLKM.

Register circuit FF#c has the same circuit configuration as register circuits FF#a and FF#b and outputs the signals N2D and ZN2D. An output signal of NOR circuits 94e is input to the other input of NAND circuit 94f. An output signal of NAND circuit 94f is input to the other input of NAND circuit 94d.

A circuit portion 96 for a burst length of eight includes a four-input NAND circuit 96a receiving the signals N0D, N1D and N2D and the internal master clock signal CLKM, an AND circuit 96b receiving an output signal of NAND circuit 96a at one input, an NOR circuit 96c receiving an output signal of AND circuit 96b and the internal data read instructing signal φread, and an inverter circuit 96d for inverting an output signal of NOR circuit 96c for inputting to the other input of NAND circuit 96b. NAND circuits 91b, 92c, 94d and 96e may be configured into composite gates with corresponding NOR circuits 91e and 92d, 94e and 96c, respectively.

Burst length counter 89 further includes a select circuit for selecting output signals N0–N3 of these circuit portions according to predetermined burst length data. The select circuit includes a clocked inverter 98a inverting and outputting the output signal N0 of NOR circuit 91e in accordance with a burst length indicating signal BL1 and a complementary burst length indicating signal ZBL1 which indicate that the burst length is one, a clocked inverter 98b activated when burst length indicating signals BL2 and ZBL2 which indicate that the burst length is two are activated for inverting and outputting the output signal N1 of NOR circuit 92d, a clocked inverter 98c inverting and outputting the output signal of NOR circuit 94e when burst length indicating signals BL4 and ZBL4 which indicate that the burst length is four are activated, and a clocked inverter 98d activated when burst length indicating signals BL8 and ZBL8 which indicate that the burst length is eight are activated for inverting and outputting the output signal N3 of NOR circuit 96c.

These burst length indicating signals are set employing a command register normally provided in SDRAMs. That is, a specific address signal bit is used at a specific operation timing (WCBR condition, for example) to set data for indicating these burst lengths.

Burst length counter 89 further includes an inverter circuit 99a receiving the internal read instructing signal φread, an NAND circuit 99b receiving an output signal of inverter circuit 99a at one input, and an NAND circuit 99c receiving an output signal of one of clocked inverters 98a, 98b, 98c and 98d at one input. An output signal of NAND circuit 99c is input to the other input of NAND circuit 99b. An output signal OEF of NAND circuit 99b is input to the other input of NAND circuit 99c. The operation of the burst length counter shown in FIG. 19 will now be described with reference to a timing chart thereof shown in FIG. 20.

In a clock cycle T0, a read command is applied and the internal read instruction signal φread attains a high level for a predetermined period. When the internal read instructing signal φread attains a high level, the output signals N0, N1, N2 and N3 of NOR circuits 91e, 92d, 94e and 96c are all reset to low level. Register circuit FF#a is set to a through state in synchronization with a rising of the complementary internal master clock signal ZCLKM and takes in and passes the low-level output signal N0, and the signal N0D attains a low level. When the signal N0D attains a low level, the signal ZN0D attains a high level. At the rising of the complementary signal ZN0D to the high level, the internal master clock signal CLKM has fallen to a low level. Thus, the output signal of NAND circuit 91b does not change and the signal N0 is held at the low level.

It is when the signal ZN0D and the internal master clock signal CLKM both attain a high level that when the internal read instructing signal φread falls to a low level, NAND circuit 91b outputs a low level signal. Thus, the signal N0 attains a high level in the next clock cycle T1 in synchronization with a rising of the master clock signal CLKM and the signal N0D rises to a high level with a delay of half the clock cycle. Since this operation is repeated thereafter, the signal N0 output from the circuit for the burst length of one changes with twice the period of the internal master clock signal CLKM and the signal N0D changes with a delay of half the clock cycle to the signal N0.

It is when the signals ZN1D and N0D and the internal master clock signal CLKM all attain high level that the output signal of NAND circuit 92a attains a low level in the circuit for the burst length of two. The signals N1 and ZN1D are signals complementary to each other, and thus the signal N1 rises to a high level in a clock cycle T2 in synchronization with a rising of the internal master clock signal CLKM. Then the signal N1D rises to a high level with a delay of half the clock cycle. Thus, the signal N1 changes with four times the period of the internal master clock signal CLKM and its high level pulse width is two clock cycles.

It is when the signals N0D and N1D, the signals ZN2D and the internal master clock signal CLKM all attain high level that the output signal of NAND circuit 94b attains a low level in the circuit for the burst length of four. The signal N2D changes according to the signal N2 with a delay of half the clock cycle. Thus, the signal N2 rises to a high level in synchronization with a rising of the internal master clock signal CLKM in a clock cycle T4. NAND circuit 94b inverts and outputs the signal ZN2D to NAND circuit 94d when the signals N0D and N1D and the internal master clock signal CLKM all attain high level. The signal ZN2D is delayed from the signal N2 by half the clock cycle. Thus, the signal N2 has its state changed every four clock cycles and falls to a low level in a clock cycle T8 in synchronization with a rising of the internal master clock CLKM. Circuits 91, 92 and 94 configure a frequency-dividing circuit and its frequency-dividing ratio is determined by signals input to each of NAND circuits 91b, 92a and 94b.

In circuit 96 for the burst length of eight, when the signals N0D, N1D and N2D and the internal master clock signal CLKM all attain high level, the output signal of NAND circuit 96a attains a low level and the signal N3 attains a high level (the signal φread attains a low level). Thus, the signal N3 rises to a high level in a clock cycle T8 in synchronization with a rising of the internal master clock signal CLKM. When the signal N3 rises to a high level, the output signal of inverter circuit 96d attains a low level, the output signal of NAND circuit 96b attains a low level, and the signal N3 is held at the high level until the internal read instructing signal φread is next applied.

Figure 20:
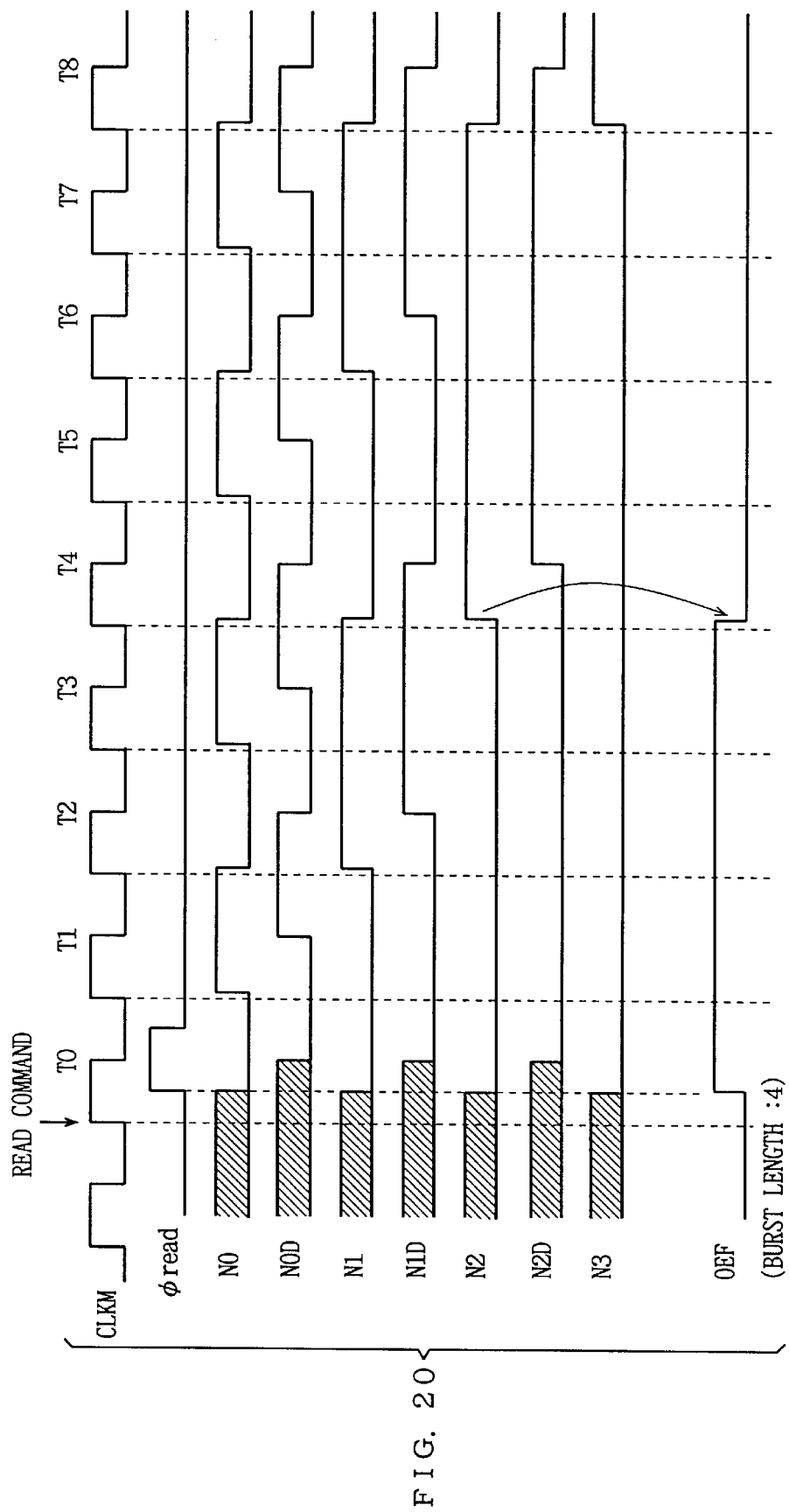
FIG. 20 is a timing chart illustrating operations of the circuits shown in FIG. 19.

One of these signals N0, N1, N2 and N3 is selected by any of clocked inverters 98a, 98b, 98c and 98d. FIG. 20 shows the change of the signal OEF when the burst length is four, that is when the burst length indicating signal BL4 attains a high level. That is, the output signal OEF (corresponding to the signal φb1 shown in FIG. 18) of the burst length counter is set to a high level in response to a rising of the internal read indicating signals φread and when the burst length is four, the signal OEF is reset to a low level when four clock cycles have elapsed, that is, in a clock cycle T4 in response to a rising of the signal N2 (since both inputs of NAND circuit 99b are set to high level).

Figure 21A:
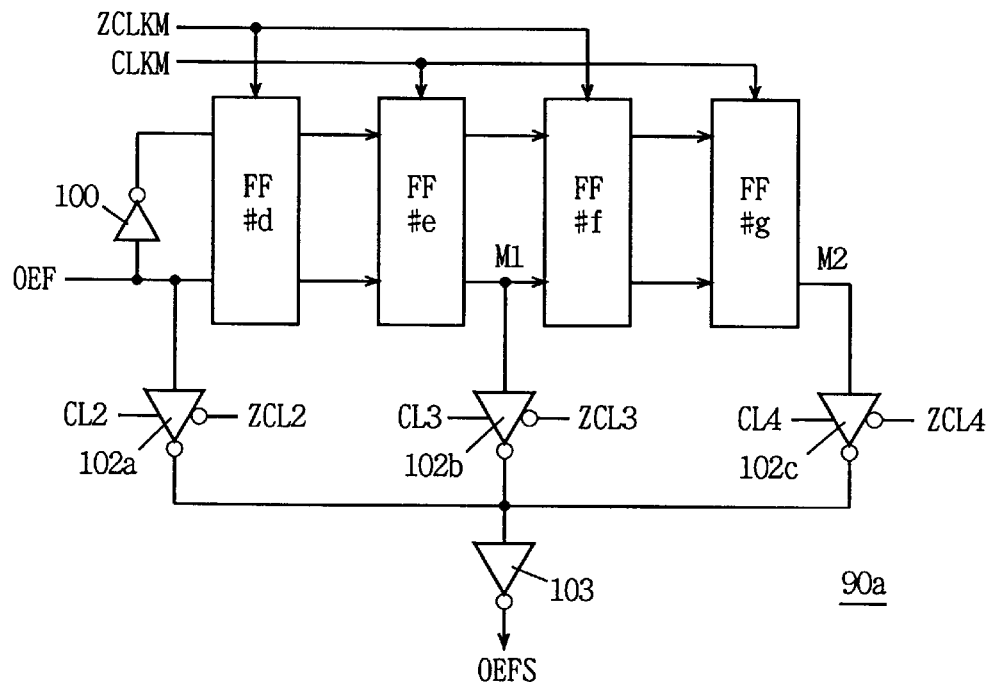
FIG. 21A shows a specific configuration of the latency counter shown in FIG. 18A

FIG. 21A shows a configuration of latency counter 90a shown in FIG. 18A. In FIG. 21A, latency counter 90a includes an inverter circuit 100 receiving the output signal OEF from the burst length counter shown in FIG. 19, a register circuit FF#d transferring the output signal OEF and the output signal from inverter circuit 100 according to the internal master clock signal ZCKLM, a register circuit FF#e transferring an output signal of register circuit FF#d in synchronization with the internal master clock signal CLKM, a register circuit FF#f transferring an output signal of register circuit FF#e in synchronization with the complementary internal master clock signal ZCLKM, and a register circuit FF#g transferring an output signal of register circuit FF#f in synchronization with the internal master clock signal CLKM. These register circuits FF#d–FF#g have the same configuration as register circuit 5a shown in FIG. 4.

Figure 21B:
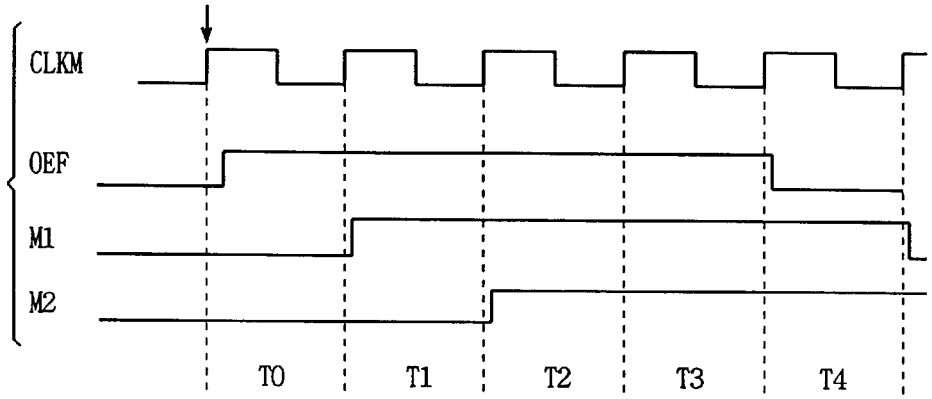
FIG. 21B is a timing chart illustrating operations of the circuits shown in FIG. 21A.

Latency counter 90a further includes an clocked inverter 102a activated when the latency indicating signals CL2 and ZCL2 which indicate that CAS latency is two are activated for inverting and outputting the signal OEF, a clocked inverter 102b activated when the signals CL3 and ZCL3 which indicate that CAS latency is three are activated for inverting and outputting an output signal M1 of register circuit FF#e, a clocked inverter 80c activated when the signals CL4 and ZCL4 which indicate that CAS latency is four are activated for inverting and outputting an output signal M2 of register circuit FF#g, and an inverter circuit 103 for inverting a signal input from any of clocked inverters 102a, 102b and 102c to output a signal OEFS. The operation of latency counter 90a shown in FIG. 21A will now be described with reference to the timing chart shown in FIG. 21B.

In a clock cycle T0, a read command is applied and the signal OEF from the burst length counter shown in FIG. 19 rises to a high level. When the burst length is four, the signal OEF attains a high level for four clock cycle period and attains a low level in a clock cycle T4 in synchronization with a rising of the internal master clock signal CLKM. Register circuits FF#d and FF#g each transfer the signal OEF with a delay of half the clock cycle. Thus, the output signal M1 of register circuit FF#e attains a high level in the clock cycle T1 in synchronization with a rising of the internal master clock signal CLKM, and the output signal M2 of register circuit FF#g attains a high level in the clock cycle T2 in synchronization with a rising of the internal master clock signal CLKM. One of these signals OEF, M1 and M2 is selected according to the CAS latency indicating signals CL2, CL3 and CL4.

Figure 22A:
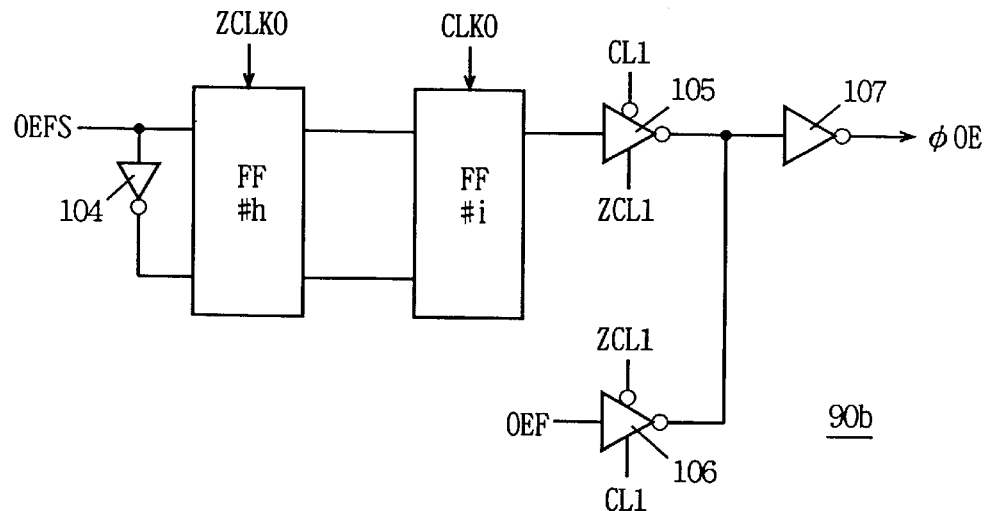
FIG. 22A shows a configuration of the counter output state shown in FIG. 18A

FIG. 22A shows a configuration of counter output stage 90b shown in FIG. 18A. In FIG. 22A, counter output stage 90b includes an inverter circuit 104 receiving the output signal OEFS from latency counter 90a shown in FIG. 21A, a register circuit FF#h transferring the signal OEFS and an output signal of inverter circuit 104 according to the complementary internal master clock signal ZCLKO, a register circuit FF#i transferring an output signal of register circuit FF#h according to the internal master clock signal CLKO, a clocked inverter 105 activated when the signals CL1 and ZCL1 which indicate CAS latency is one are inactivated for inverting an output signal of register circuit FF#i, a clocked inverter 106 activated when the signals CL1 and ZCL1 are activated for inverting and outputting the output signal OEF of the burst length counter shown in FIG. 19, and an inverter circuit 107 for inverting a signal input from any of clocked inverters 105 and 106 to output the output permission signal φOE. These register circuits FF#h and FF#i have the same configuration as register circuit 5a shown in FIG. 4. The operation of counter output stage 90b shown in FIG. 22A will now be described with reference to the timing chart shown in FIG. 22B.

Figure 22B:
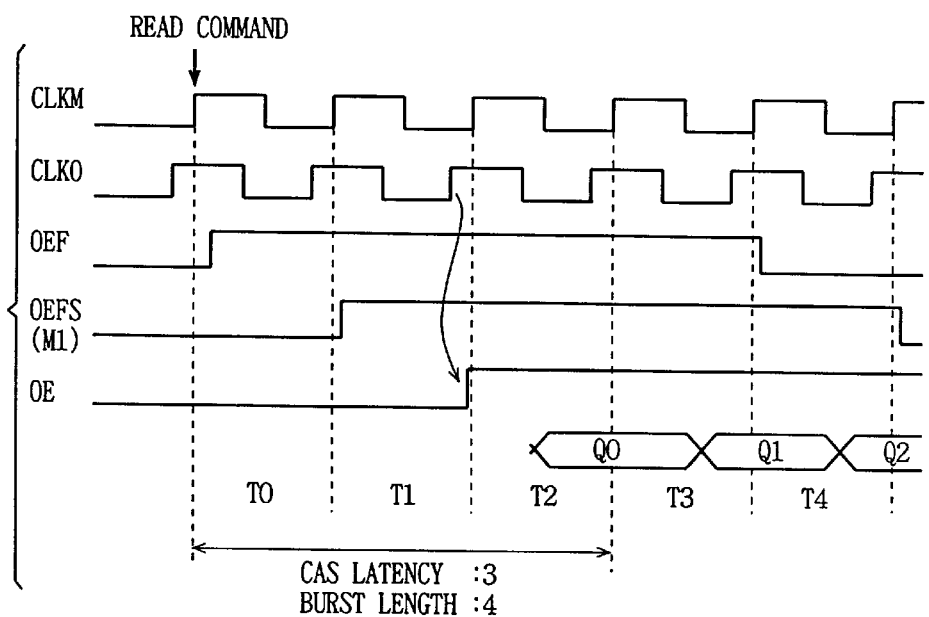
FIG. 22B is a timing chart illustrating its operation.

In a clock cycle T0, a read command is applied and the signal OEF rises to a high level. FIG. 22B shows the timing chart when the burst length is four. When the CAS latency is three, the output signal M1 of register circuit FF#e shown in FIG. 21A is selected. In this case, the signal OEFS is delayed from the signal OEF by one clock cycle of the internal master clock signal CLKM. When the CAS latency is three, clocked inverter 105 is activated and when the output signal of register circuit FF#i rises, the output permission signal φOE attains an active high level. That is, after the signal OEFS rises, the output permission signal φOE attains an active high level in synchronization with the next rising of the internal clock signal CLKO. As shown in FIG. 22B, when the CAS latency is three, the output permission signal φOE attains a high level in the clock cycle T1 in synchronization with a rising of the clock signal CLKO.

Although an SDRAM to which two-bit prefetch method is applied is described in the second embodiment, a configuration of selection of two-bit data is not limited to the configuration shown in FIGS. 10 and 12, and any configuration can be employed as long as two-bit data simultaneously selected is successively selected according to a clock signal.

Furthermore, a transfer gate such as a CMOS transmission gate may be used in place of a clocked nverter.

Furthermore, it is needless to say that pipelined transfer circuits according to the first embodiment may be provided in the two-bit prefetch method of the second embodiment. That is, output data of a preamplifier may be latched and the two-bit latched data may be selected according to the selection/transfer control signals φe and φo and then transferred to the output buffer via pipeline stages. In this example, each pipeline stage performs transfer operation synchronously with the internal clock signal CLKO for output.

In the timing chart shown in FIG. 22B, the CAS latency is three, and data is transferred in the clock cycle T2 in synchronization with a rising of the internal clock signal CLKO for output and valid data is output (Q0). Thereafter, data are successively output every clock cycle.

As described above, according to the second embodiment, two bits are alternately selected and transferred to the output buffer circuit according to an internal clock signal for output in the two-bit prefetch method, so that access time is also reduced and fast access can be also achieved in the two bit prefetch method. Furthermore, since the selection/transfer control signals φe and φo each attain an active high level in synchronization with a falling of the internal clock signal CLKO for output, transferred data can be prevented from being output as it is to the outside in data transfer operation so that accurate data transfer and data read operation can be ensured.

Specifically, since the transfer control signals φe and φo are produced by the logic product of the internal master clock signal CLKM (or the signals φef and φof) and the inverted version of the internal clock signal CLKO for output, data is transferred when the data is surely read by a preamplifier and then latched internally, and penetration of the pipeline stages can be prevented.

Furthermore, provision of an output latch within the output buffer circuit allows the output buffer circuit to also constitute a pipeline stage, so that switching of valid data in synchronization with a clock signal for output is ensured and fast access is achieved (since there is no reset operation of the output buffer circuit and thus valid data output period is increased).

[Third Embodiment]

Figure 23A:
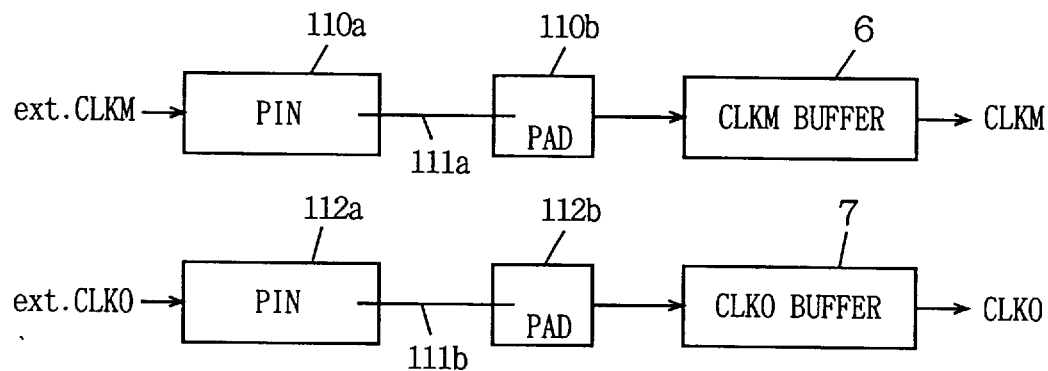
FIGS. 23A and 23B show a configuration of a clock signal switching portion according to a third embodiment of the present invention.
Figure 23B:
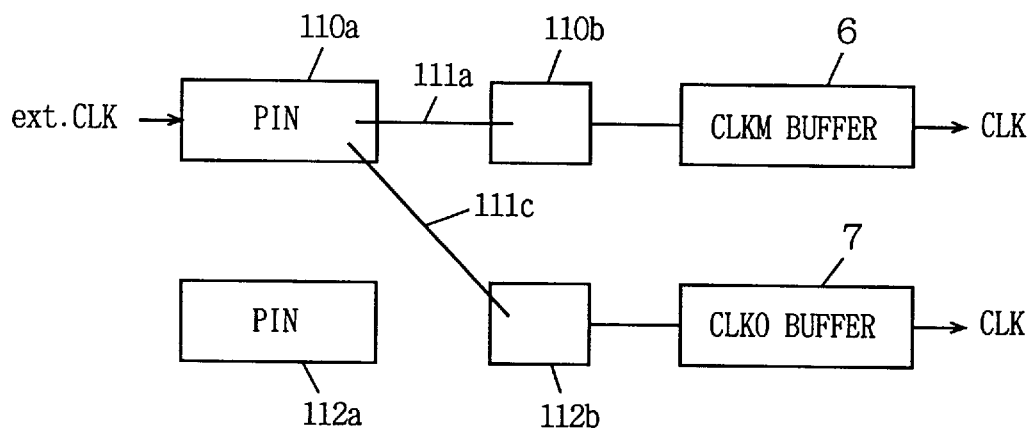

FIGS. 23A and 23B show a configuration of a main portion of an SDRAM according to a third embodiment of the present invention, a configuration for switching an external clock signal.

In FIG. 23A, a clock input portion includes a pin terminal 110a as a first node for receiving an externally applied clock signal extCLKM, a pad 110b electrically connected to pin terminal 110a via a bonding wire 111a, a CLKM buffer 6 for buffering an external clock signal extCLKM from pad 110b to produce an internal master clock signal CLKM, a pin terminal 112a as a second node for receiving an externally applied clock signal extCLK for output, a pad 112b electrically connected to pin terminal 112a via a bonding wire 111b, and a CLKO buffer 7 for buffering a clock signal supplied via pad 112b to produce an internal clock signal CLKO for output. CLKM buffer 6 and CLKO buffer 7 have a similar configuration to that described in the first embodiment. The internal clock enable signal CKE is, however, not shown. In the example shown in FIG. 23A, the SDRAM uses two clock signals which are different in phase from each other, as described in the first and second embodiments, to achieve fast access.

In FIG. 23B, pin terminal 110a allocated to a master clock signal externally receives one clock signal extCLK. Pin terminal 110a is electrically connected to pads 110b and 112b via bonding wires 110a and 111c, respectively. In this example, CLKM buffer 6 and CLKO buffer 7 produce a same internal clock signal CLK. Thus, with the pad connection shown in FIG. 23B, an SDRAM takes in external control signals and an address signal and outputs data in accordance with one internal clock signal CLK.

As described above, according to the third embodiment of the present invention, since pads provided corresponding to separately provided pin terminals are selectively connected to a specified pad by bonding wires, both a fast accessible SDRAM operable according to two clock signals and an SDRAM similar to conventional ones operating according to only one clock signal can be obtained with a single SDRAM chip, so that a single SDRAM chip can be used for two applications. Thus, it is not necessary to manufacture an SDRAM chip dedicated for each application, so that manufacturing cost can be reduced and an SDRAM chip which flexibly accommodates applications can be obtained.

[Fourth Embodiment]

Figure 24:
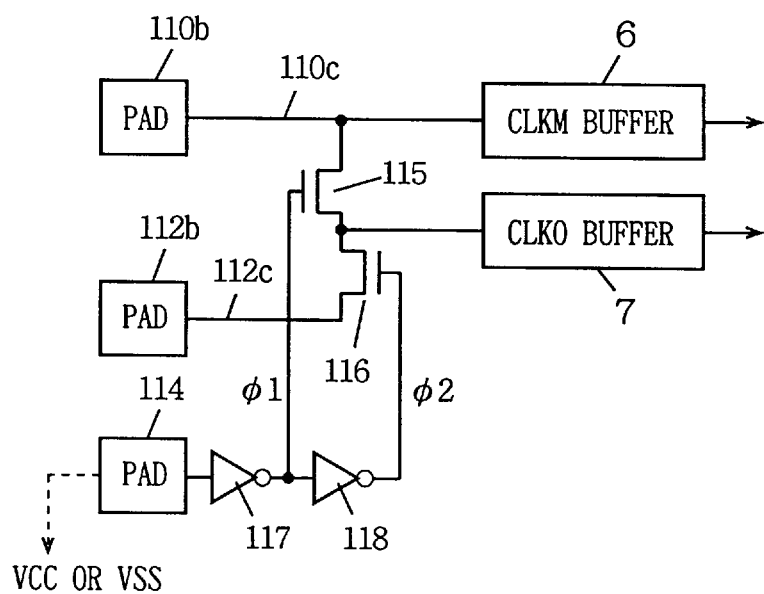
FIG. 24 schematically shows a configuration of a clock signal switching portion according to a fourth embodiment of the present invention.

FIG. 24 shows a configuration of a clock generating portion of an SDRAM according to a fourth embodiment of the present invention. In the configuration shown in FIG. 24, in addition to pad 10b allocated to the master clock signal extCLKM and pad 112b allocated to the internal clock signal extCLKO for output, another pad 114 is further arranged as an internal node. Pad 114 is coupled by a bonding wire to receive a power supply voltage Vcc potential or a ground voltage VSS potential.

N channel MOS transistors 115 and 116 as first and second switching elements are connected in series between an internal interconnection line 110c from pads 110b and 112b and an internal interconnection line 112c connected to pad 112b. CLKM buffer 6 is electrically connected to pad 110b via internal interconnection line 110c. CLKO buffer 7 is selectively and electrically connected to pads 110b and 112b via MOS transistors 115 and 116.

Pad 114 are provided with an inverter circuit 117 receiving a signal on pad 114, and an inverter circuit 118 receiving an output signal of inverter circuit 117. A signal $\phi 1$ from inverter circuit 117 is supplied to the gate of MOS transistor 115, and a signal $\phi 2$ from inverter circuit 118 is supplied to the gate of MOS transistor 116.

When pad 114 is bonded to receive the power supply voltage VCC, the signal $\phi 1$ attains a low level and the signal $\phi 2$ attains a high level so that CLKO buffer 7 receives a clock signal supplied to pad 112b and CLKM buffer 6 receives a clock signal from pad 110b. Thus, when different clock signals are input to pads 110b and 112b in this state, internal operation is performed according to two clock signals.

On the other hand, when pad 114 is connected to receive the ground potential VSS, the signal $\phi 1$ attains a high level and the signal $\phi 2$ attains a low level so that MOS transistor 115 is turned on and MOS transistor 116 is turned off. In this state, CLKO buffer 7 is electrically coupled to pad 110b and thus the SDRAM takes in control signals and an address signal and outputs data according to a clock signal input to pad 110b.

Since the numbers of control signals, address signals and of data input/output bits are increased in SDRAMs, a plurality of power supply pins and ground pins are provided in SDRAMs so that input buffer and output buffers for these signals can operate stably. Thus, pad 114 can be arranged near both pins receiving a power supply voltage and pins receiving a ground voltage to readily bonding pad 114 to power supply voltage Vcc pins or ground voltage VSS pins alternatively.

The signals $\phi 1$ and $\phi 2$ may have their potential levels set by mask interconnections, respectively. When mask interconnection is used, two kinds of masks are required for setting potentials of the signals $\phi 1$ and $\phi 2$, while all connections by bonding wires between pads and pin terminals are the same in both of two types.

Furthermore, the following arrangement may be employed alternatively. When pad 114 is made open, a signal line for pad 114 is set at a predetermined potential level, when the predetermined potential level at the pad is to be inverted, and the pad is bonded to a corresponding potential pin (VCC or VSS). In this example, even if there is no terminal or node near pad 114 for supplying both the power supply voltage VCC and the ground voltage VSS, control signals $\phi 1$ and $\phi 2$ for clock switching can be reliably produced.

As described above, according to the fourth embodiment of the present invention, since use of two clock signals and use of only one clock signal is alternatively set according to a potential of a specific pad (an external optional pad) or of a specific internal node, an SDRAM chip employing two clock signals and an SDRAM chip employing only one clock signal can be obtained with a single chip.

[Fifth Embodiment]

Figure 25A:
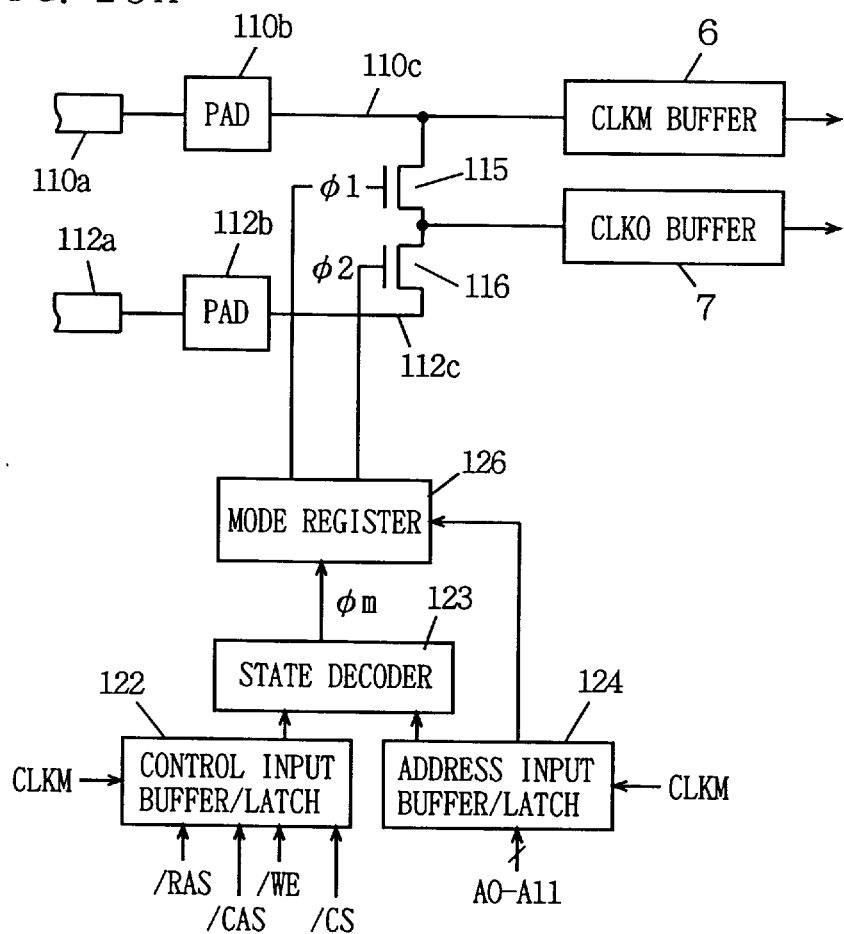
FIG. 25A shows a configuration of a clock switching portion according to a fifth embodiment of the present invention and FIG. 25B is a waveform diagram illustrating a method of setting mode register data.

FIG. 25A schematically shows a configuration of a clock signal switching portion of an SDRAM according to a fifth embodiment of the present invention. In the configuration shown in FIG. 25A, the signals $\phi 1$ and $\phi 2$ supplied to the gates of MOS transistors 115 and 116 for selecting a clock signal to be input to CLKO buffer 7 are output from a mode register 126. The mode register is normally used to set operation manner (CAS latency, burst length data, data input/output mode or the like) of the SDRAM. Such mode register 126 is used to select an internal clock signal.

Figure 25B:
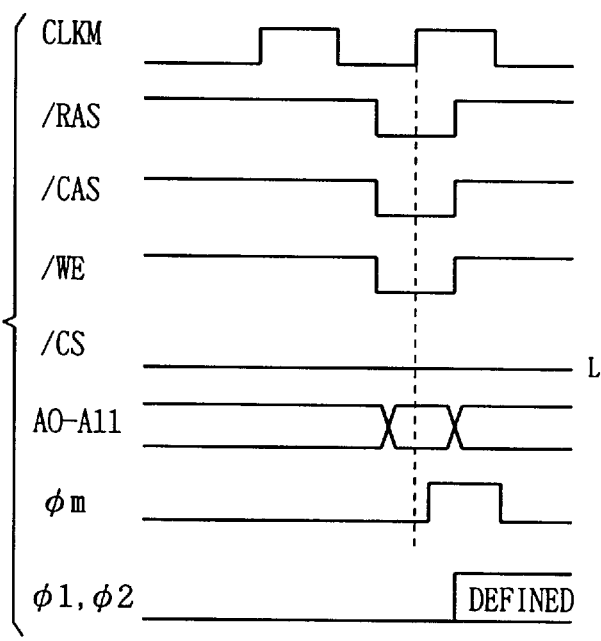

In order to set clock designating data in mode register 126, there are provided a control input buffer/latch 122 incorporating and latching externally applied control signals, that is, a row address strobe signal /RAS, a column address strobe signal /CAS, a write enable signal /WE and a chip select signal /CS in synchronization with the internal master clock signal CLKM to produce an internal control signal, an address input buffer/latch 124 taking in and latching an externally applied address signal in synchronization with the internal master clock signal CLKM, and a state decoder 123 receiving an internal control signal from control input buffer/latch 122 and a specific address signal bit from address input buffer/latch 124 to determine whether a select signal setting mode has been designated for mode register 126. In a mode of setting clock selection control signals φ1 and φ2, a signal φm from state decoder 123 is activated and mode register 126 takes and latches a specific address signal bit applied from address input buffer/latch 124 as clock selection control data. The data setting operation for mode register 126 will now be described with reference to the timing chart shown in FIG. 25B.

At a rising edge of the internal master clock signal CLKM, the external control signals /RAS, /CAS, /WE and /CS attain low level and a specific address signal bit of external address signal bits A0–A11 is set at a predetermined value. This state is knows as the "WCBR+address key" condition in a typical standard DRAM. When this specific condition is satisfied, state decoder 123 activates the signal φm. Mode register 126 responds to the activated signals φm to take and latch the specific address signal bit applied from address input buffer/latch 124. This allows the clock selection control signals φ1 and φ2 to be set at predetermined states, respectively.

When mode register 126 is employed, one of the mode in which two clock signals are used and the mode in which only one clock signal is used can be externally set after the SDRAM chip is packaged. Thus, switching through bonding wire is not required and a single SDRAM can be used for two applications.

In FIG. 25A, control input buffer/latch 122 and state decoder 123 correspond to control signal generating portion 22 shown in FIG. 5. Address input buffer/latch 124 corresponds to address buffer 24 shown in FIG. 5.

[Modification]

Figure 26:
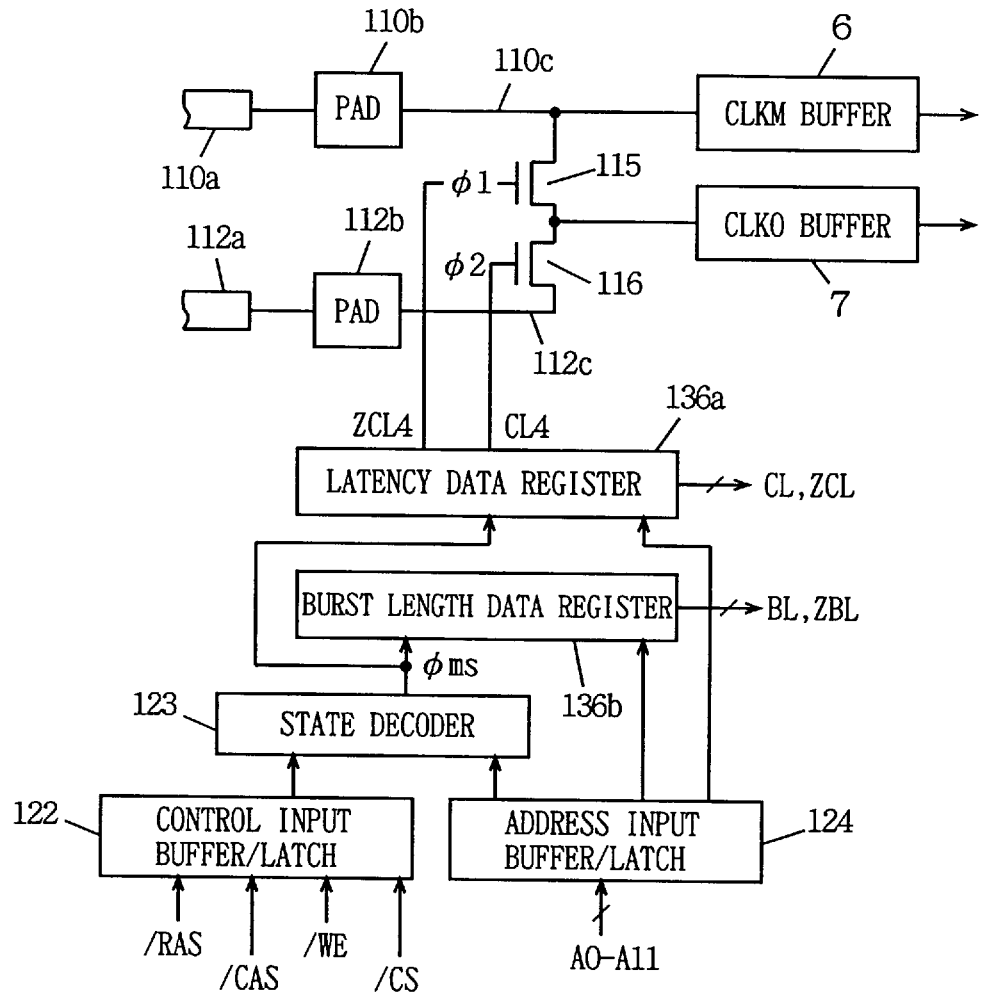
FIG. 26 shows a configuration of a modification according to a fifth embodiment of the present invention.

FIG. 26 shows a configuration of a modification of the fifth embodiment of the present invention. In the configuration shown in FIG. 26, the latency indicating signals ZCL4 and CL4 from a latency data register 136a are used as the control signals φ1 and φ2 for MOS transistors 115 and 116 for switching a clock signal. FIG. 26 also shows a burst length data register 136b. Typically an SDRAM contains latency data register 136a for storing latency data and burst length data register 136b as a mode register. A mode of setting data in data registers 136a and 136b is designated according to the WCBR+address key condition. When the data setting mode for this mode register is designated, state decoder 123 activates its output signal φms.

When the signal φms is activated, latency data register 136a and burst length data register 136b each store a specific address signal bit input from address input buffer/latch 124, and output CAS latency indicating signals CL and ZCL and burst length indicating signals BL and ZBL, respectively, according to the stored data. The CAS latency data, burst length data and the like are held in latency data register 136a and burst length data register 136b until these data are newly set externally.

By using latency data register 136a and burst length data register 136b, the user can set the optimal CAS latency and burst length depending on the application. Generally, it is a tacit agreement that an SDRAM operates according to a faster clock signal (150 MHz, for example) when CAS latency is four and that an SDRAM with CAS latency of three or two is used within a processing system operating according to a clock signal of a relatively low frequency (67 MHz, for example). It is where an external clock signal has a high frequency that two kinds of clock signals CLKM and CLKO are especially required. Thus, the signal CL4 activated (set to a high level) when the CAS latency is four is used as the control signal φ2 and the inverted signal ZCL4 is used as the control signal φ1.

When the CAS latency is four, MOS transistor 116 is turned on and MOS transistor 115 is turned off so that CLKM buffer 6 and CLKM buffer 7 produce internal clock signals CLKM and CLKO according to external clock signals extCLKM and extCLKO input to pads 110b and 112b, respectively. On the other hand, when the CAS latency is two or three, the signal ZCL4 attains a high level, MOS transistor 115 is turned on and MOS transistor 116 is turned off. In this state, CLKM buffer 6 and CLKO buffer 7 produce an internal clock signal according to a clock signal input to pad 110b via pin terminal 110a.

The use of a latency indicating signal stored in latency data register 136a as a clock selection control signal allows to automatically set a mode for using a specific clock within an SDRAM without the user's consciousness of the mode setting. In addition, switching of bonding wire is not required and thus manufacturing process is simplified. Furthermore, an SDRAM operable under the optimal operating conditions depending on the application can be obtained without increasing load of the user.

Figure 27:
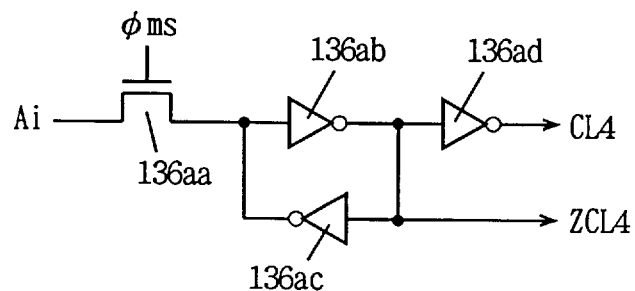
FIG. 27 shows one example of the configuration of the unit bit register of a register shown in FIGS. 25 and 26.

FIG. 27 shows one example of the configuration of mode register 126 shown in FIG. 25A and latency data register 136a and burst length data register 136b shown in FIG. 26, wherein a configuration of a one-bit data register is representatively shown. These registers have a same configuration and FIG. 27 representatively shows a configuration of one-bit data register of latency data register 136a. In FIG. 27, a unit latency data register includes a transfer gate 136aa turned on when a control signal φms is activated (set to a high level) to pass a predetermined address signal (supplied from the address input buffer/latch) Ai, an inverter circuit 136ab for inverting a signal from transfer gate 136aa, an inverter circuit 136ab for inverting an output signal of inverter circuit 136ab to produce the latency indicating signal CL4, and an inverter circuit 136ac for inverting the output signal of inverter circuit 136ab for transmission to an input portion of inverter circuit 136ab. Inverter circuit 136ab outputs the latency indicating signal ZCL4. The configuration shown in FIG. 27 is an inverter latch, and logic levels of the latency indicating signals CL4 and ZCL4 are set according to the address signal bit Ai.

Transfer gate 136aa shown in FIG. 27 may be configured by a CMOS transmission gate or clocked inverter. The unit data register may be configured by the register circuit (FF) shown in FIG. 4. Furthermore, data stored in the data register may be decoded to produce a latency indicating signal.

As described above, according to the fifth embodiment of the present invention, since a clock signal to be used is selected within an SDRAM according to a control signal, switching of bonding wire connection is not required and thus a single SDRAM chip can be applied to any of the operating environment in which two clock signals are used and the operating environment in which only one clock signal is used.

Furthermore, the clock selection is performed according to the CAS latency data to obtain an SDRAM operating under the optimal operating conditions depending on the application without increasing load of the user.

[Sixth Embodiment]

Figure 28A:
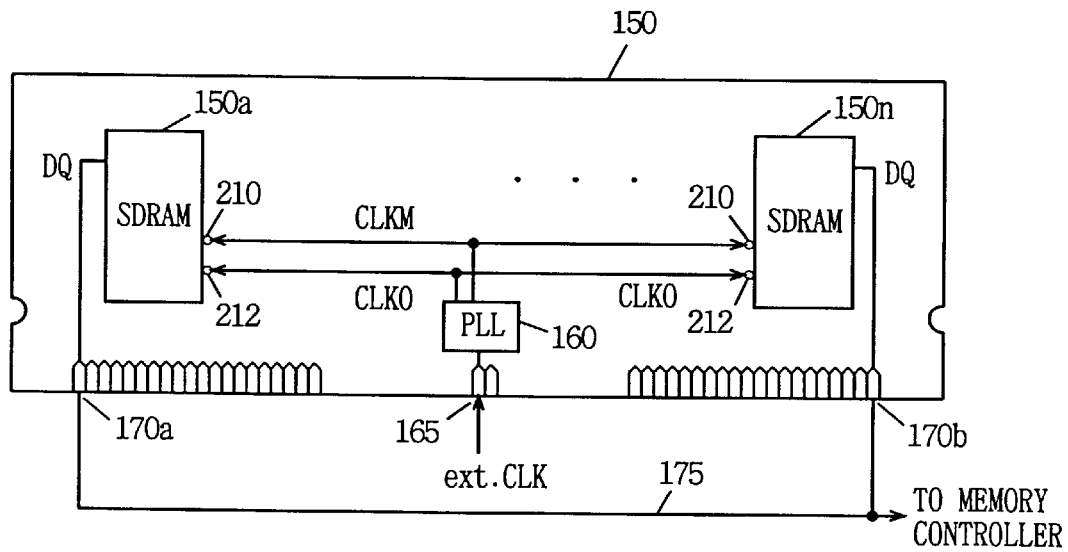
FIG. 28A schematically shows a configuration of a synchronous memory module according to a sixth embodiment of the present invention and FIG. 28B is a waveform diagram illustrating an operation of the phase locked loop shown in FIG. 28A.

FIG. 28A schematically shows a configuration of a synchronous memory module according to a sixth embodiment of the present invention. In FIG. 28A, a memory module 150 includes a plurality of SDRAM chips 150a–150n. Each of SDRAMs 150a–150n has the configuration described in the first to fifth embodiments and includes a first clock input node 210 and a second clock input node 212 separately provided. Clock input nodes 210 and 212 may be pads provided on respective chips of SDRAMs 150a–150n, or may be pads (corresponding to lead pins) arranged external to the chips for connecting the pads provided on the chips of SDRAMs 150a–150n to an interconnection line within the module. SDRAMs 150a–150n operate in parallel with each other and data input/output nodes DQs are connected to data input/output pin terminals 170a–170b, respectively. In FIG. 28 an SDRAMs 150a–150n are shown all operating simultaneously in parallel. However, a predetermined number of SDRAMs may be set to selected state simultaneously.

Memory module 150 further includes a phase locked loop (PLL) 160 which receives the clock signal extCLK applied from a memory controller (not shown) via a clock input pin 165. Phase locked loop 160 buffers the external clock signal extCLK applied via clock input pin 165 and performs phase control, and compares the phase of a clock signal generated by phase locked loop 160 with that of the externally applied clock signal extCLK and cancels delay due to buffering process and the like in phase locked loop 160 to produce an internal clock having exactly the same phase as the externally applied clock signal extCLK.

Phase locked loop 160 produces a plurality of clock signals having a same frequency as the external clock signal extCLK but being different in phase from the external clock signal extCLK. That is, phase locked loop 160 produces a master clock signal CLKM and a clock signal CLKO for output the phase of which is in advance of that of the master clock signal CLKM to be supplied respectively to the first and second clock input nodes 210 and 212 of SDRAMs 150a–150n.

Phase locked loop 160 can be used to remove rounding of the external clock signal extCLK and delay of the external clock signal extCLK due to buffering so that SDRAMs 150a–150n can operate precisely in synchronization with the external clock signal extCLK. Furthermore, there is no delay nor clock skew in buffering the clock signal so that fast access can be achieved.

Figure 28B:
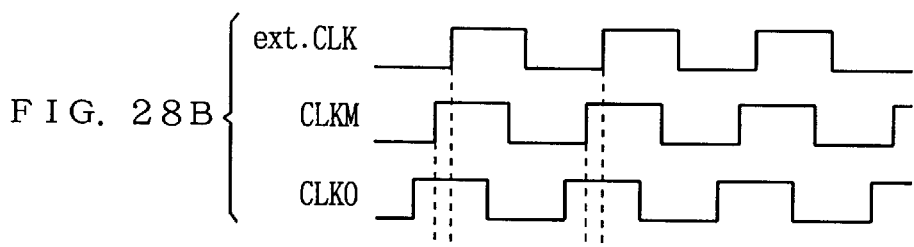

In FIG. 28B, the phases of clock signals CLKM and CLKO produced by phase locked loop 160 are both shown being in advance of that of the external clock signal extCLK. This emphasizes cancellation of delay in clock buffering and furthermore indicates compensation for propagation delay of the external clock signal extCLK.

In such a memory module also, phase locked loop 160 can be used to produce two clock signals CLKM and CLKO which synchronize with the external clock signal extCLK but are different in phase from each other for application to SDRAMs 150a–150n, so that a clock access time tAC in SDRAMs 150a–150n can be reduced and thus fast access can be achieved. Phase looked loop 160 is incorporated in memory module 150. Thus, memory module 150 is externally seen as a memory module operating according to one clock signal extCLK. Thus, memory module 150 shown in FIG. 28A can be used in place of a conventional memory module to achieve an SDRAM module operable at high speed with reduced clock access time tAC.

[Modification]

Figure 29:
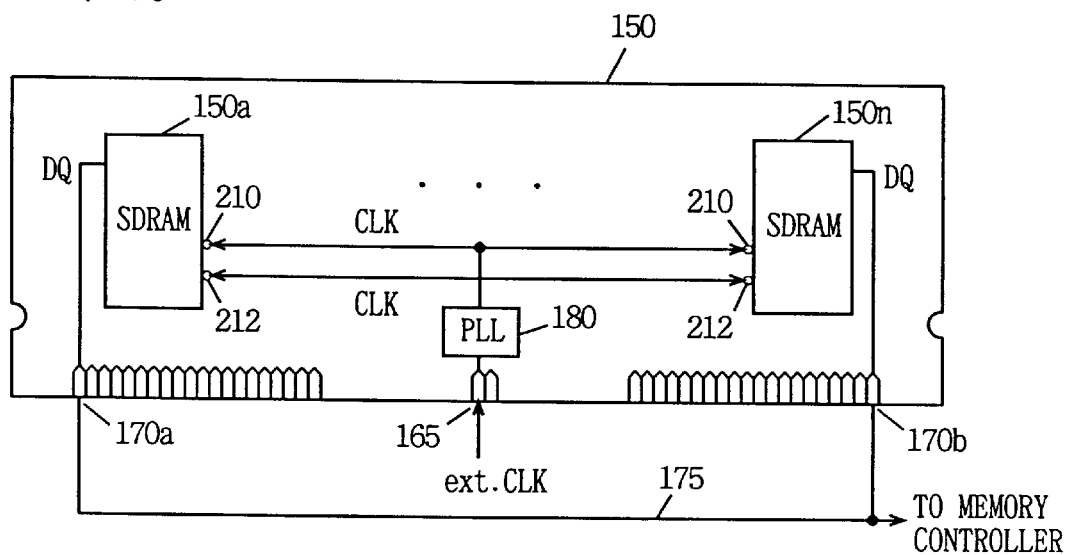
FIG. 29 shows a configuration of a modification of the synchronous memory module shown in FIG. 28A.
Figure 30:
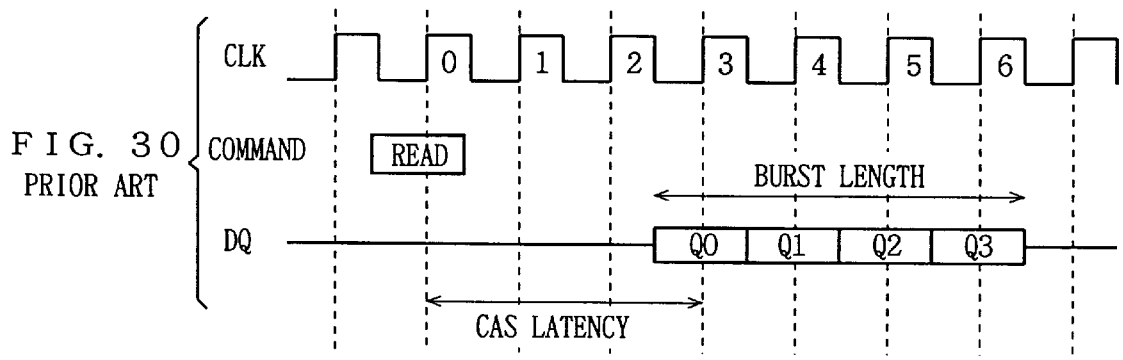
FIG. 30 is a timing chart illustrating data read operation of a conventional SDRAM.
Figure 32A:
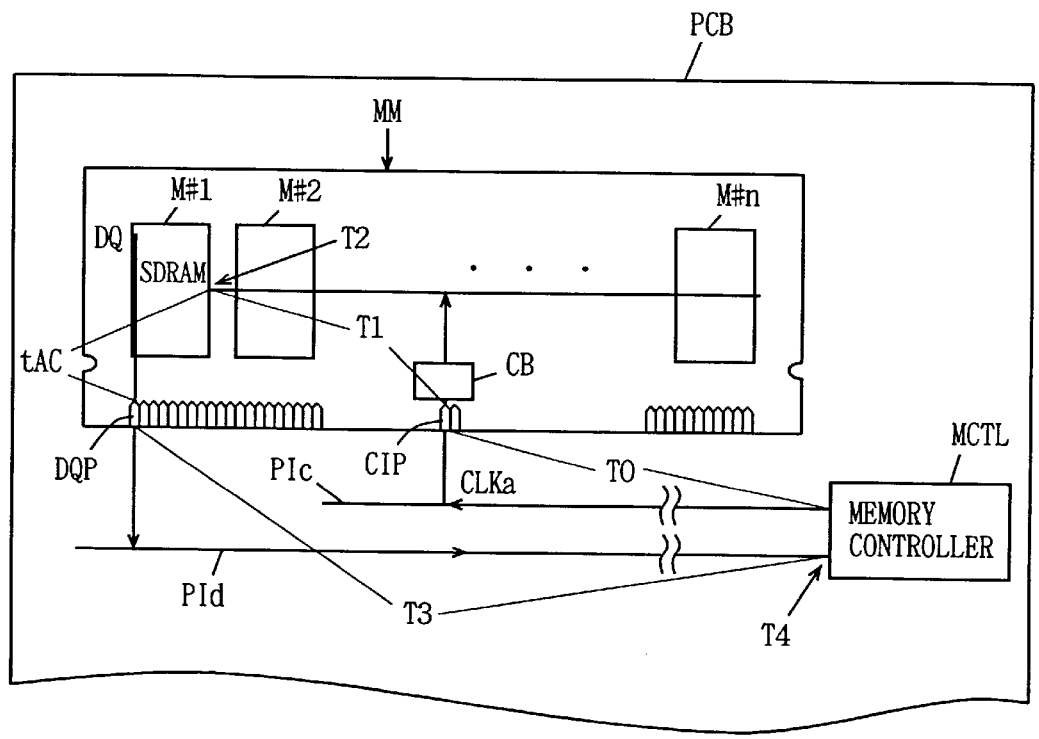
FIG. 32A shows a configuration of a conventional synchronous memory module and FIG. 32B illustrates a relation between a clock cycle and the time required for data access in the synchronous memory module shown in FIG. 32A.
Figure 32B:
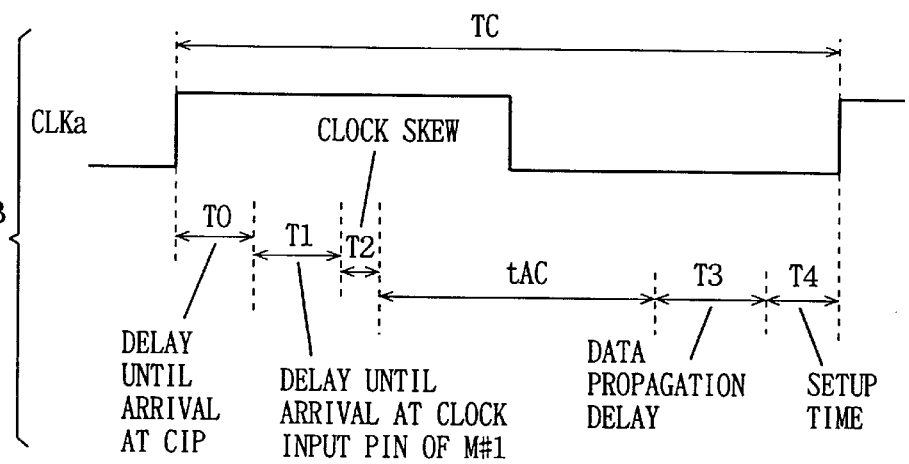

FIG. 29 shows a configuration of a modification of the sixth embodiment of the present invention. In the configuration shown in FIG. 29, a phase locked loop 180 provided within memory module 150 produces one clock signal CLK the phase of which synchronizes with that of the external clock signal extCLK applied via clock input pin (terminal) 165. The clock signal CLK produced by phase looked loop 180 is input commonly to the first and second nodes 210 and 212 of SDRAMs 150a–150n. Thus, SDRAMs 150a–150n operate synchronously with one clock signal CLK and hence operates similarly to conventional SDRAMs. Thus, an SDRAM according to the present invention can configure a memory module having the same characteristics as modules of the conventional SDRAMs.

Thus, when a memory module is configured using one kind of SDRAM, an SDRAM module having two kinds of operating characteristics can be obtained depending on the configuration of the phase locked loop.

While a phase looked loop PLL is used in the sixth embodiment, a delay locked loop DLL may be used.

[Another Application]

Although an SDRAM having dynamic type memory cells has been described, the present invention is applicable to any semiconductor memory device capable of taking control signals and address signals and inputting/outputting data in synchronization with a clock signal such as a synchronous SRAM (static RAM) and a similar effect can be also obtained. Furthermore, the present invention is applicable to a semiconductor memory device (a pipe line burst mode DRAM, for example) in which the internal data read path is configured in a pipeline.

As described above, according to the present invention, since a clock signal for memory cell selection and internal data reading is different from a clock signal for outputting the internally read data to the outside of the device, clock access time and data hold time can be adjusted and thus a synchronous semiconductor memory device having the optimal operating characteristics depending on the system applied can be obtained. Particularly, the advancing of the phase of the clock signal for data output with respect to that of the clock signal for internal data allows to reduce the clock access time, and thus fast access can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:
   a first node receiving an externally applied first clock signal applied repetitively;
   a first clock buffer for receiving the first clock signal to generate a first internal clock signal corresponding to the first clock signal;
   input buffer means receiving an externally applied control signal and address signal in synchronization with said first internal clock signal applied from said first clock buffer to produce an internal control signal and an internal address signal for selecting a memory cell in a memory cell array including a plurality of memory cells;
   a second node receiving an externally applied second clock signal, separate from said first clock signal and repetitively applied in parallel with said first clock signal;
   a second clock buffer for receiving the second clock signal to produce a second internal clock signal corresponding to the second clock signal; and output buffer means receiving and buffering internal read data read from the selected memory cell to produce and output external read data to an output node in synchronization with said second internal clock signal applied from the second clock buffer.

2. The synchronous semiconductor memory device according to claim 1, wherein the first clock signal is the same in frequency as, but different in phase from the second clock signal.

3. The synchronous semiconductor memory device according to claim 1, wherein the second clock signal precedes in phase the first clock signal, but is the same in frequency as the first clock signal.

4. The synchronous semiconductor memory device according to claim 1, further comprising means for activating an output enable signal in synchronization with said second internal clock signal, wherein said output buffer means includes means activated in response to activation of said output enable signal for externally outputting said received internal read data.

5. The synchronous semiconductor memory device according to claim 1, wherein said first clock buffer includes means for receiving the first clock signal for producing a one shot pulse signal of a predetermined pulse width in accordance with a leading edge of said first clock signal for application to said input buffer means as the first internal clock signal; and said second clock buffer includes means for receiving the second clock signal for producing a one shot pulse signal of the predetermined pulse width in accordance with a leading edge of said second clock signal for application to said output buffer means as the second internal clock signal.

6. The synchronous semiconductor memory device according to claim 1, further comprising:

a read data bus;

internal read means for selecting a memory cell of said memory cell array according to the internal control signal and the internal address signal from said input buffer means, for transmitting data of the selected memory cell onto said read data bus as said internal read data, said data of the selected memory cell being sensed and amplified by a sense amplifier; and first transfer gate means provided between said read data bus and said output buffer means and turned on in response to said second internal clock signal for transferring the internal read data on said read data bus to said output buffer means.

7. The synchronous semiconductor memory device according to claim 6, further comprising first latch means provided between said first transfer gate means and said output buffer means for latching and transferring data transferred from said first transfer gate means to said output buffer means.

8. The synchronous semiconductor memory device according to claim 6, further comprising second latch means provided between said internal read means and said first transfer gate means for latching and transferring the internal read data read out by said internal read means on said read data bus to said first transfer gate means.

9. The synchronous semiconductor memory device according to claim 8, further comprising second transfer gate means provided between said internal read means and said second latch means and turned on after said first transfer gate means is turned off for transferring internal read data read out by said internal read means to said second latch means.

10. The synchronous semiconductor memory device according to claim 9, wherein said internal read means outputs said internal read data, when said first internal clock signal attains a first level, onto said read data bus, and further comprising:

control means responsive to turning off of said first transfer gate means and to outputting of said internal read data of said internal read means for turning on said second transfer gate means.

11. The synchronous semiconductor memory device according to claim 9, further comprising control means taking a logic product of the first internal clock signal and an inverted version of the second internal clock signal for turning on said second transfer gate means in accordance with a signal indicating a result of the logic product.

12. A synchronous semiconductor memory device comprising:

a first node for receiving an externally applied first clock signal applied repetitively;

a second node for receiving an externally applied second clock signal repetitively applied in parallel with said first clock signal when the second clock signal is applied to the synchronous semiconductor memory device;

input buffer circuitry receiving an externally applied control signal and address signal in synchronization with said first clock signal to produce an internal control signal and an internal address signal for selecting a memory cell in a memory cell array including a plurality of memory cells;

clock selection circuitry for selecting a clock signal applied to one of the first and second nodes; and output buffer circuitry for receiving and buffering internal read data read from the selected memory cell to produce and output external read data externally in synchronization with the clock signal selected by said clock selection circuitry.

13. The synchronous semiconductor memory device according to claim 12, wherein said first and second nodes each are a lead for receiving an externally applied signal, and wherein said clock selection circuitry includes a pad provided corresponding to said second node, and an interconnection line alternatively selecting and electrically connecting one of said first and second nodes to said pad.

14. The synchronous semiconductor memory device according to claim 12, wherein said clock selection circuitry includes:

a first switching element coupled to receive said first clock signal from said first node;

a second switching element coupled to receive said second clock signal applied from said second node; and switching control means coupled to an internal node receiving a fixed voltage for alternatively turning on one of said first and second switching elements according to a fixed potential on said internal node.

15. The synchronous semiconductor memory device according to claim 12, wherein said clock selection circuitry includes:

a first switching element coupled to receive said first clock signal from said first node;

a second switching element coupled to receive said second clock signal applied from said second node; and control means responsive to an external mode designating signal for alternatively turning on one of said first and second switching elements.

16. The synchronous semiconductor memory device according to claim 12, wherein said clock selection circuitry includes:

a first transistor coupled to said first node, a second transistor coupled to said second node, a data register for storing latency data indicating the number of clock cycles required from application of an access command instructing reading out of data to an external outputting of valid data, and means coupled between said data register and said first and second transistors for alternatively turning on one of said first and second transistors in accordance with said latency data.

17. A synchronous memory module comprising:

a plurality of synchronous semiconductor memory devices each including (a) a first pad, (b) input buffer means for incorporating a control signal and an address signal externally applied in synchronization with a clock signal externally applied to said first pad to produce an internal control signal and an internal address signal for selecting a memory cell in a memory array including a plurality of memory cells, (c) a second pad provided separately from said first pad, and (d) output means for buffering an internal read data read from the selected memory cell to produce and externally output thus produced read data in synchronization with a clock signal externally applied to said second pad; and internal clock generating means receiving a repetitively applied external clock signal for producing first and second clock signals in synchronization with the external clock signal, and for commonly applying said first clock signal to said first pad of each of said plurality of synchronous semiconductor memory devices and commonly applying said second clock signal to said second pad of each of said plurality of synchronous semiconductor memory devices.

18. The synchronous memory module according to claim 17, wherein said first and second clock signals are a same common clock signal.

19. The synchronous memory module according to claim 17, wherein said first clock signal is different in phase from and the same in frequency as said second clock signal.

20. The synchronous memory module according to claim 19, wherein said second clock signal is in advance in phase of said first clock signal.

* * * * *